(12) United States Patent
Li

(10) Patent No.: US 12,336,328 B2
(45) Date of Patent: Jun. 17, 2025

(54) HIGH COLOR GAMUT PHOTOLUMINESCENCE WAVELENGTH CONVERTED WHITE LIGHT EMITTING DEVICES

(71) Applicant: INTEMATIX CORPORATION, Fremont, CA (US)

(72) Inventor: Yi-Qun Li, Danville, CA (US)

(73) Assignee: Intematix Corporation, Fremont, CA (US)

( * ) Notice: Subject to any disclaimer, the term of this patent is extended or adjusted under 35 U.S.C. 154(b) by 452 days.

(21) Appl. No.: 17/770,931

(22) PCT Filed: Oct. 23, 2020

(86) PCT No.: PCT/US2020/057226
§ 371 (c)(1),
(2) Date: Apr. 21, 2022

(87) PCT Pub. No.: WO2021/081455
PCT Pub. Date: Apr. 29, 2021

(65) Prior Publication Data
US 2022/0352416 A1 Nov. 3, 2022

Related U.S. Application Data

(60) Provisional application No. 62/924,747, filed on Oct. 23, 2019.

(51) Int. Cl.
*H10H 20/812* (2025.01)
*H10H 20/851* (2025.01)

(52) U.S. Cl.
CPC ...... *H10H 20/812* (2025.01); *H10H 20/8512* (2025.01)

(58) Field of Classification Search
CPC .............................. H01L 33/06; H01L 33/502
See application file for complete search history.

(56) References Cited

U.S. PATENT DOCUMENTS 10,371,325 B1    8/2019  Yuan
10,424,270 B2    9/2019  Tomabechi et al.
(Continued)

FOREIGN PATENT DOCUMENTS

JP    2001196645 A    7/2001
JP    2012069572 A    4/2012
(Continued)

OTHER PUBLICATIONS

English Translation of JP Application No. 2022-522733. Final Office Action mailed Oct. 31, 2023.
(Continued)

*Primary Examiner* — Jay C Chang
*Assistant Examiner* — Mikka Liu
(74) *Attorney, Agent, or Firm* — Shirley A. Recipon

(57) ABSTRACT

A white light emitting device (backlight) comprises: a Multiple Quantum Well (MQW) dual-wavelength LED; and a narrowband photoluminescence material that generates red light with a peak emission wavelength from about 620 nm to about 660 nm. The MQW dual-wavelength LED comprises at least one first Quantum Well (QW) that generates blue light with a dominant wavelength from 440 nm to 470 nm and at least one second Quantum Well (QW) to generate green light with a dominant wavelength from 520 nm to 540 nm.

13 Claims, 17 Drawing Sheets

(56) References Cited

U.S. PATENT DOCUMENTS

| | | | |
|---|---|---|---|
| 10,941,339 B2 | 3/2021 | Ichikawa et al. | |
| 2009/0001389 A1* | 1/2009 | Wang | H01L 27/15 257/89 |
| 2010/0244066 A1* | 9/2010 | Chiu | C09K 11/7794 252/301.5 |
| 2010/0252847 A1* | 10/2010 | Chiu | C09K 11/7736 423/306 |
| 2011/0248295 A1 | 10/2011 | Stauss et al. | |
| 2016/0254410 A1 | 9/2016 | Mirhosseini-Schubert | |
| 2017/0194535 A1 | 7/2017 | Park | |
| 2018/0323339 A1 | 11/2018 | Robin | |
| 2018/0341055 A1* | 11/2018 | Yuan | G02B 6/0053 |
| 2019/0198709 A1 | 6/2019 | Wildeson | |

FOREIGN PATENT DOCUMENTS

| | | |
|---|---|---|
| JP | 2018190830 A | 11/2018 |
| JP | 2019061230 A | 4/2019 |
| KR | 100552333 B1 | 2/2006 |
| KR | 1020070098113 A | 10/2007 |
| KR | 20160018636 A | 2/2016 |
| KR | 1020170112759 A | 10/2017 |
| WO | 2012021643 A2 | 2/2012 |
| WO | 2013008125 A1 | 1/2013 |
| WO | 2017091619 A1 | 11/2016 |
| WO | 2018/217645 A1 | 11/2018 |
| WO | 20180217645 A1 | 11/2018 |
| WO | 2019173025 A1 | 9/2019 |

OTHER PUBLICATIONS

EP Application No. 20807976.4, Communication pursuant to Article 94(3) EPC, Jan. 29, 2024. NEW.
KR Application No. 1020227016976, Notice to Submit Response, mailed Mar. 4, 2024. New.
English Translation of KR Application No. 1020227016976, Notice to Submit Response, mailed Mar. 4, 2024.
Machine English Translation of KR Application 1020170112759, Oct. 12, 2017, SKC Hi-Tech & Marketing Co., Ltd New.
Machine English Translation of KR Application 1020070098113, Oct. 5, 2007, Seoul Semiconductor Co., Ltd.
JP Application No. 2022-522733. Decision of refusal, mailed May 21, 2024.
English Translation of JP Application No. 2022-522733. Decision of refusal, mailed May 21, 2024. New ?
PCT/US2020/057226, International Search Report.
PCT/US2020/057226, Written Opinion of the International Search Authority.
EP Application No. 20807976.4, Communication pursuant to Article 94(3) EPC, Apr. 28, 2023.
English Translation of JP Application No. 2022-522733. Non-Final Office Action mailed May 16, 2023.
Machine Translation KR 1020170129009A, Nov. 24, 2017, LG Innotek.

* cited by examiner

SECTION B-B

SECTION B-B

HIGH COLOR GAMUT PHOTOLUMINESCENCE WAVELENGTH CONVERTED WHITE LIGHT EMITTING DEVICES

CROSS-REFERENCE TO RELATED APPLICATIONS

This application claims the benefit of priority to U.S. Provisional application No. 62/924,747, filed 23 Oct. 2019 which is hereby incorporated by reference in its entirety.

FIELD OF THE INVENTION

Embodiments of the invention concern photoluminescence wavelength converted white light emitting devices. More particularly, although not exclusively, embodiments are directed to high color gamut devices for color Liquid Crystal Displays (LCDs).

BACKGROUND OF THE INVENTION

Photoluminescence wavelength converted white light emitting devices, often referred to as "white LEDs", typically comprise a blue LED and include one or more photoluminescence materials (typically inorganic phosphor materials), which absorb a portion of the blue light emitted by the LED and re-emit light of a different color (wavelength). Such white LEDs are referred to as blue pumped (excited) photoluminescence wavelength converted white LEDs. The portion of the blue light generated by the LED that is not absorbed by the phosphor material combined with the light emitted by the phosphor provides light which appears to the eye as being white in color. For general lighting and backlights for color LCDs, the white LED typically comprises a combination of yellow to green and red emitting photoluminescence materials. Due to their long operating life expectancy (>50,000 hours) and high luminous efficacy (100 lumens per watt and higher), white LEDs are rapidly replacing conventional fluorescent, compact fluorescent and incandescent lamps in general lighting applications.

Color LCDs find application in a variety of electronics devices including televisions, computer monitors, laptops, tablet computers and smart phones. As is known, most color LCDs comprise a liquid crystal (LC) display panel and a white light emitting backlight for operating the display panel. Color purity and color gamut (e.g. National Television System Committee NTSC colorimetry 1953 (CIE 1931) RGB color space standard) are two of the most important parameters for the color quality of LCD displays, and are determined by the spectrum of the light generated by the white LEDs used in the backlight and the RGB (Red Green Blue) color filters of the display. Currently, the majority of white LEDs used in LCD backlights are blue pumped wavelength converted white LEDs. The ideal white light spectrum for high color gamut displays is composed of narrowband red, narrowband blue and narrowband green emission peaks with peak emission wavelengths corresponding to the RGB color filters of the display. Over the past 15 years, white LEDs used for LCD backlighting have a spectrum consisting of a) a narrowband blue emission peak generated by the LED and broadband green and broadband red emission peaks generated by phosphors such as green silicates and red nitrides or b) a narrowband blue emission peak generated by the LED and a single broadband yellow emission peak generated by a yellow phosphor such as YAG. Recently, manganese-activated fluoride phosphors with narrowband red emission peaks at about 631 nm have been adopted for backlighting white LEDs. However, suitable phosphors having a narrowband green emission and with a full width at half maximum intensity (FWHM) of less than 40 nm are not available for implementing high color gamut displays.

The present invention arose in an endeavor to overcome, at least in part, the limitations and shortcomings of existing backlights and to improve the color gamut of backlights for LCD displays.

SUMMARY OF THE INVENTION

Embodiments of the invention relate to photoluminescence wavelength converted light emitting devices comprising Multiple Quantum Well (MQW) dual-wavelength Light Emitting Diodes (LEDs) that generate both narrowband blue and narrowband green light emissions. In this patent specification, a MQW dual-wavelength LED is defined as a single LED die (or chip) that generates light of two (dual) different colors (wavelengths) corresponding to blue and green light. The LED die can be of a monolithic construction and the die may comprise respective blue and green light generating quantum wells integrated in a single chip or a single LED structure comprising combined blue/green light generating quantum wells for generating both blue and green light. One or both of the blue or green light generating quantum wells may itself (themselves) comprise a plurality (multiple) of blue or green quantum wells; that is one or both of the blue or green quantum wells may constitute a MQW structure.

In accordance with embodiments, there is provided a light emitting device (backlight) comprising: a MQW dual-wavelength LED; and a narrowband photoluminescence material that generates red light with a peak emission wavelength ($\mu_{pe}$) from about 620 nm to about 660 nm; and wherein the MQW dual-wavelength LED comprises at least one first Quantum Well (QW) to generate blue light with a dominant wavelength ($\lambda_{d1}$) from 440 nm to 470 nm and at least one second QW to generate green light with a dominant wavelength ($\lambda_{d2}$) from 520 nm to 540 nm. Since the MQW dual-wavelength LED generates narrowband blue and narrowband green light emissions, and the narrowband photoluminescence material generates a narrowband red light emission, the device of the invention is operable to generate light having a color Gamut that is superior compared with known devices and constructions.

In embodiments, the Multiple Quantum Well dual-wavelength LED can comprise at least one of: a plurality first Quantum Wells and a plurality of second Quantum Wells, that is one or both of the blue or green light generating quantum wells constitutes a MQW structure. The blue and green MQW structures can be fabricated at respective separate regions of a single chip (monolithic device) or as a single blue/green MQW structure in which blue and green quantum well structures are fabricated at the same region of the chip, for example, a MQW structure layer comprising a stack of interposed (e.g. alternating) blue and green QWs.

In embodiments the blue light and/or green light can have a FWHM emission intensity, for example, from about 15 nm to about 45 nm, from about 25 nm to 45 nm, or from about 15 nm to about 25 nm. The FWHM emission intensity of the blue light generated by the dual-wavelength LED can be selected by configuring the indium doping concentration, width, number and dominant wavelength spacing of the first QWs of the LED. Similarly, the FWHM emission intensity of the green light generated by the dual-wavelength LED can be selected by configuring the indium doping concentration, width, number and dominant wavelength spacing of the second QWs.

In embodiments the narrowband red photoluminescence material can have a FWHM emission intensity, for example, from about 5 nm to about 30 nm or from about 10 nm to about 25 nm. The narrowband photoluminescence material can generate red light with a peak emission wavelength ($\lambda_{pe}$) from about 620 nm to about 640 nm. The narrowband photoluminescence material can comprise inorganic and/or organic phosphor materials, Quantum Dot (QD) materials, dyes and combinations thereof.

In embodiments, the blue and green light comprise a respective peak, and a ratio of the peak emission intensity of the green light peak to the peak emission intensity of the blue light peak is at least 30%, at least 40%, at least 50%, at least 60%, from 30% to 60%, from 30% to 50%, from 30% to 40%, from 40% to 50%, from 40% to 60%, or from 50% to 60%.

In some embodiments, the photoluminescence material comprises a manganese-activated fluoride phosphor. Light emitting devices comprising a manganese activated fluoride phosphor in combination with a MQW dual-wavelength LED are found to generate light with a particularly superior color gamut. In embodiments, where the narrowband photoluminescence material comprises a manganese-activated fluoride phosphor, in particular $K_2SiF_6:Mn^{4+}$, the device may generate light with a spectrum having a color gamut which is at least 90% of the area of the NTSC (National Television System Committee NTSC colorimetry 1953 (CIE 1931)) RGB color space standard and/or DCI-P3 (Digital Cinema Initiative) RGB color space standard. In embodiments, the manganese-activated fluoride photoluminescence material may comprise $K_2SiF_6:Mn^{4+}$ that generates red light with a dominant peak emission wavelength from about 630 nm to about 632 nm. In embodiments, the manganese-activated fluoride photoluminescence material may comprise $K_2TiF_6:Mn^{4+}$. In embodiments, the manganese-activated fluoride photoluminescence material may comprise $K_2GeF_6:Mn^{4+}$. The manganese-activated fluoride photoluminescence material may also comprise a general composition selected from the group consisting of: $K_2SnF_6:Mn^{4+}$, $Na_2TiF_6:Mn^{4+}$, $Na_2ZrF_6:Mn^{4+}$, $Cs_2SiF_6:Mn^{4+}$, $Cs_2TiF_6:Mn^{4+}$, $Rb_2SiF_6:Mn^{4+}$, $Rb_2TiF_6:Mn^{4+}$, $K_3ZrF_7:Mn^{4+}$, $K_3NbF_7:Mn^{4+}$, $K_3TaF_7:Mn^{4+}$, $K_3GdF_6:Mn^{4+}$, $K_3LaF_6:Mn^{4+}$ and $K_3YF_6:Mn^{4+}$.

In embodiments, the narrowband photoluminescence material can comprise a europium-activated sulfide phosphor such as a Group IIA/IIB selenide sulfide-based phosphor material of general composition based on $MSe_{1-x}S_x:Eu$, where M is at least one of Mg, Ca, Sr and Ba. An example of such a phosphor material is Calcium Selenium Sulfide "CSS" phosphor ($CaSe_{1-x}S_x:Eu$). To improve reliability, the europium-activated selenium sulfide phosphor material particles can be coated with one or more oxides, for example: aluminum oxide ($Al_2O_3$), silicon oxide ($SiO_2$), titanium oxide ($TiO_2$), zinc oxide (ZnO), magnesium oxide (MgO), zirconium oxide ($ZrO_2$), boron oxide ($B_2O_3$) or chromium oxide (CrO).

In embodiments, the narrowband photoluminescence material can comprise a Quantum Dot (QD) material. In preferred embodiments the quantum dot material comprises cadmium selenide (CdSe–FWHM≈20-30 nm), cadmium selenium sulfide ($CdSe_xS_{1-x}$–FWHM≈20-30 nm), indium phosphide (InP–FWHM≈45 nm), or indium gallium phosphide (InGaP–FWHM≈45 nm). Such quantum dot materials in combination with a MQW dual-wavelength LED are found to generate light with a particularly superior color gamut that is greater than 90% of the area of the NTSC and DCI-P3 RGB color space standards.

In some embodiments, the light emitting device comprises a packaged arrangement in which the photoluminescence material is disposed on the MQW dual-wavelength LED. For example, the photoluminescence material can be disposed in a package containing the LED including, but not limited to, Surface Mount Device (SMD) packaging arrangements. Alternatively, the photoluminescence material can be deposited directly on individual LED dies, in a Chip Scale Package (CSP) arrangement.

In other embodiments, the light emitting device comprises a remote photoluminescence (e.g. remote phosphor) arrangement in which the photoluminescence material comprises a photoluminescence layer, such as for example a photoluminescence sheet, located remotely to the LED. In this patent specification "Remotely" means in a spaced or separated relationship. The separation can be an air gap or may include a light transmissive medium between the LED and photoluminescence layer/sheet. Such a remote phosphor arrangement can find particular application in a display backlight and the photoluminescence layer can comprise a layer of the display.

In various embodiments, the photoluminescence material can be dispersed in a light transmissive medium. The light transmissive medium may comprise a dimethyl silicone or phenyl silicone. For better matching with the refractive index of the photoluminescence material, phenyl silicone (refractive index ~1.54) or dimethyl silicone (refractive index 1.41) can be selected based on the composition of the photoluminescence material used. For instance, $K_2SiF_6:Mn^{4+}$ (refractive index 1.4) may be dispersed in a dimethyl silicone while $K_2TiF_6:Mn^{4+}$ (refractive index >1.5) may be dispersed in a phenyl silicone.

While light emitting devices of the present invention arose in relation to backlights for color LCDs, light emitting devices comprising a MQW dual-wavelength LED and red photoluminescence material may also find utility to general lighting applications. In general lighting applications, for instance, the MQW dual-wavelength LED can be configured to generate blue light and/or green light having a dominant wavelength from 500 nm to 560 nm and a broader Full Width at Half Maximum (FWHM) emission intensity, for example, from about 15 nm to about 60 nm, from about 25 nm to about 60 nm, or from about 45 nm to about 60 nm. In general lighting applications, for example, the red photoluminescence material may have a peak emission intensity wavelength from 600 nm to 660 nm; that is in the orange to red region of the visible spectrum. The red photoluminescence material may comprise a broadband red photoluminescence material such as a europium-activated nitride-based photoluminescence material such as a Calcium Aluminum Silicon Nitride-based phosphor of general composition $CaAlSiN_3:Eu$ (CASN) or $(Sr,Ca)AlSiN_3:Eu$ (SCASN). The photoluminescence material may additionally comprise a narrowband red photoluminescence material. The light emitting device can comprise packaged arrangements for example SMD packaging arrangements, Chip On Board (COB), LED filaments—Chip On Glass (COG), and Chip Scale Package (CSP) arrangements or remote phosphor arrangements.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION OF THE INVENTION

Figure 1:
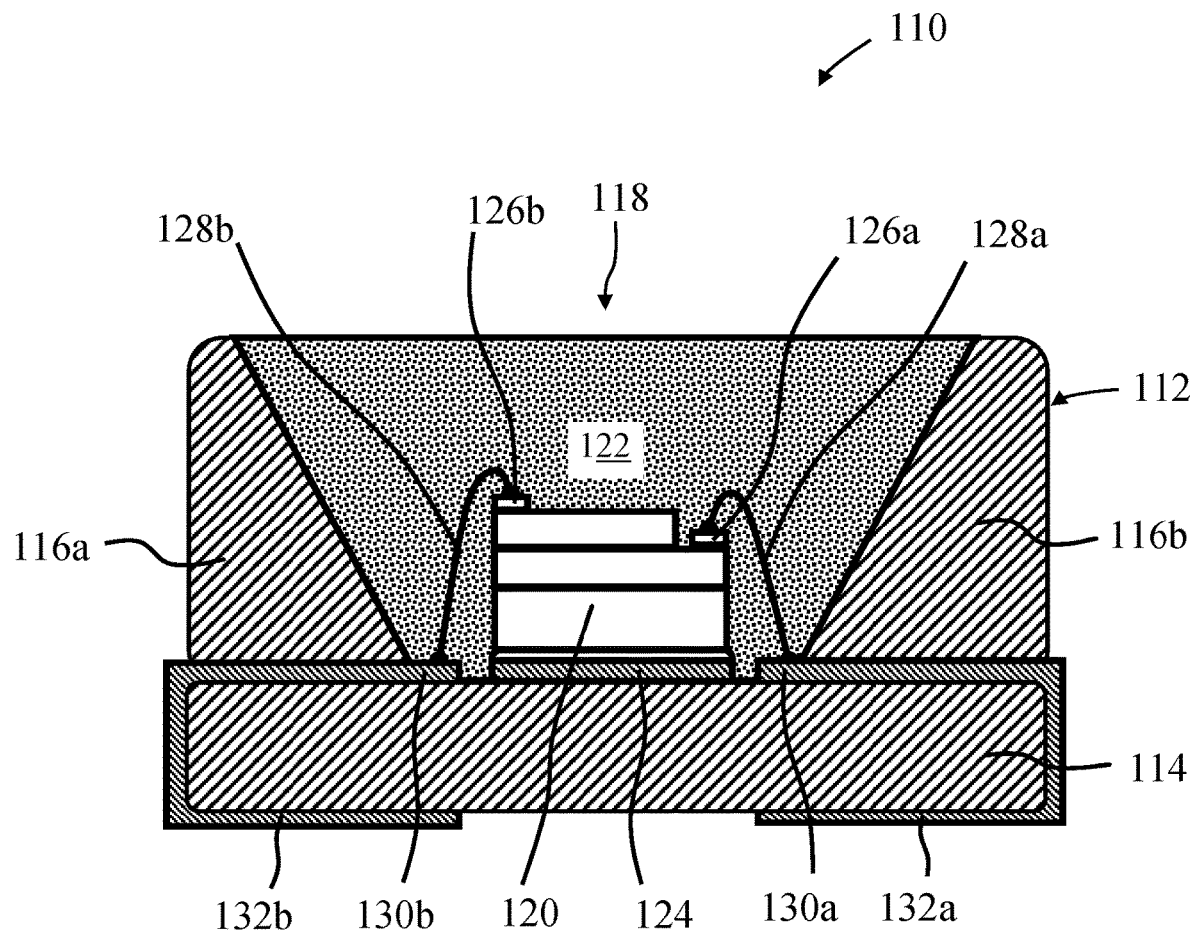
FIG. 1 is a sectional side view of a packaged photoluminescence wavelength converted white light emitting device in accordance with an embodiment of the invention.

Embodiments of the present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration. Throughout this specification like reference numerals preceded by the figure number are used to denote like (equivalent) parts.

Embodiments of the invention concern photoluminescence wavelength converted light emitting devices comprising MQW dual-wavelength LEDs that generate blue and green light emissions. As described above, MQW dual-wavelength LED is defined as a single LED die (or chip) that generates light of two (dual) different colors (wavelengths) blue and green.

Packaged White Light Emitting Devices/Backlights

A packaged photoluminescence wavelength converted white light emitting device 110 in accordance with an embodiment of the invention will now be described with reference to FIG. 1 which shows a sectional side view of the light emitting device 110. The light emitting device 110 is a packaged-type device comprising, for example a Surface Mounted Device (SMD) 2835 LED package (lead frame) 112. The SMD package 112 comprises a generally rectangular base 114 and side walls 116a, 116b extending upwardly from opposing edges of the base 114. The interior surfaces of the side walls 116a, 116b slope outwardly from the base in a vertical direction as shown and together with the interior surface of the base 114 define a cavity 118 in the shape of an inverted frustum of a pyramid.

In this embodiment, the cavity 118 contains one or more dual-wavelength LED dies 120 (only one is illustrated in FIG. 1) and a photoluminescence layer 122 comprising a red emitting photoluminescence material that fills the cavity 118. The red photoluminescence material is operable to generate red light having a peak emission wavelength ($\lambda_{pe}$) in a range 620 nm to 660 nm.

The LED dies 120 are mounted on a respective bonding pad 124 on a floor of the cavity 118. The, or each, LED die 120 comprises an n-electrode 126a and a p-electrode 126b on opposing ends of its upper surface. Bond wires 128a, 128b connect the n-electrode 126a and the p-electrode 126b to corresponding contact pads 130a, 130b which are mounted on the floor of the cavity 118. The contact pads 130a, 130b are electrically connected to external contact pads 132a and 132b on the underside of the base 114.

The photoluminescence layer 122 can be constituted by a phosphor material, typically in the form of particles that are dispersed in a light transmissive optical encapsulant (medium), such as for example a silicone material. The photoluminescence layer 122 can as illustrated be in contact with the LED dies 120 and as shown fills the cavity 118. Depending on device application, the photoluminescence material can be a broadband (FWHM emission intensity from about 25 nm to about 60 nm) or narrowband (FWHM emission intensity from about 5 nm to about 25 nm) material depending on device application. Examples of broadband and narrowband red photoluminescence materials are described below.

MQW Dual-Wavelength LEDs

In accordance with the invention, the MQW dual-wavelength LED die 120 can comprise InGaN/GaN (Indium Gallium Nitride/Gallium Nitride) MQW dual-wavelength LED dies comprising: a) one or more first quantum wells (QWs) that in operation generate blue light with a dominant wavelength ($\lambda_{d1}$) from 440 nm to 470 nm and b) one or more second QWs that in operation generate green light with a dominant wavelength ($\lambda_{d2}$) from 520 nm to 540 nm. Typically, the MQW dual-wavelength LED will comprises a plurality of first and second quantum wells; that is the first and second QWs themselves each comprise a respective MQW structure.

Figure 2A:
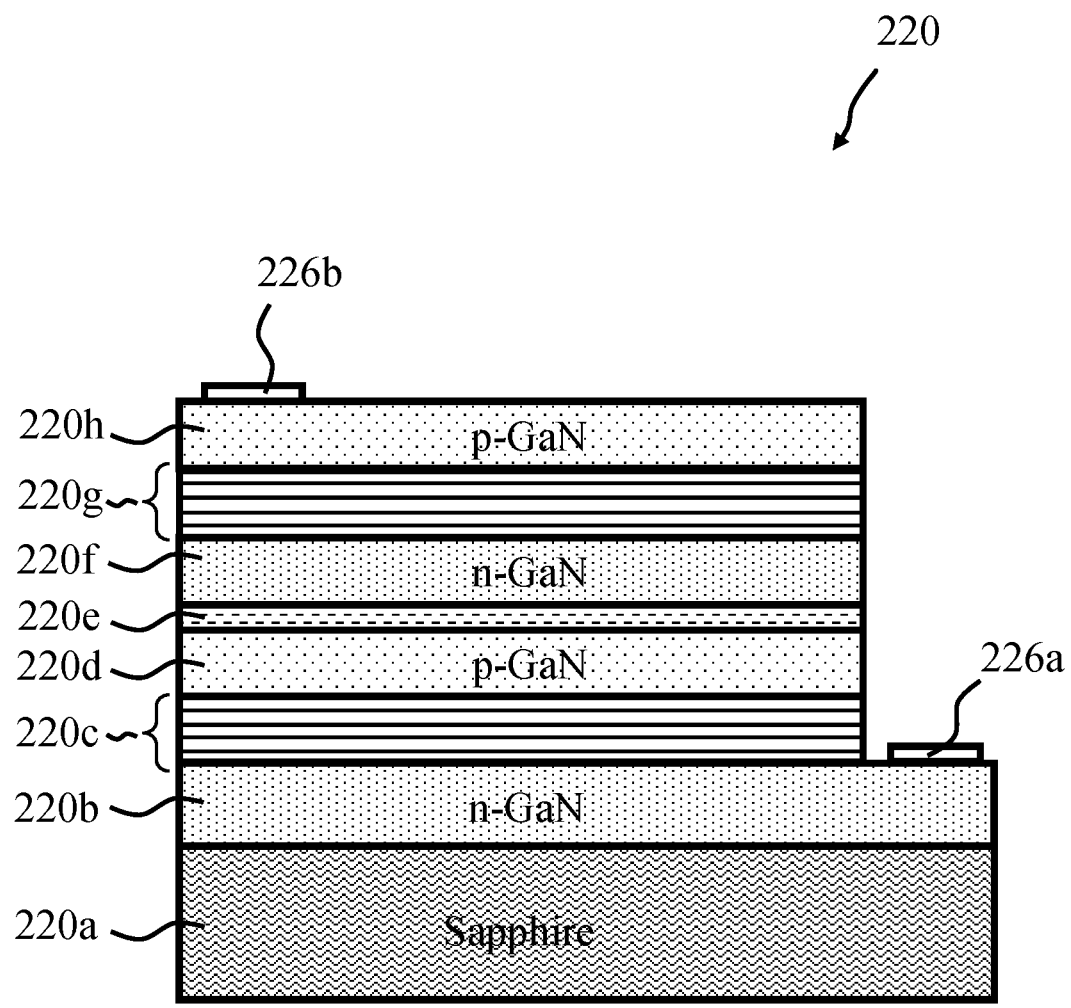
FIGS. 2A, 2B and 2C are schematic representations of example Multiple Quantum Well (MQW) dual-wavelength LED chip structures.
Figure 2B:
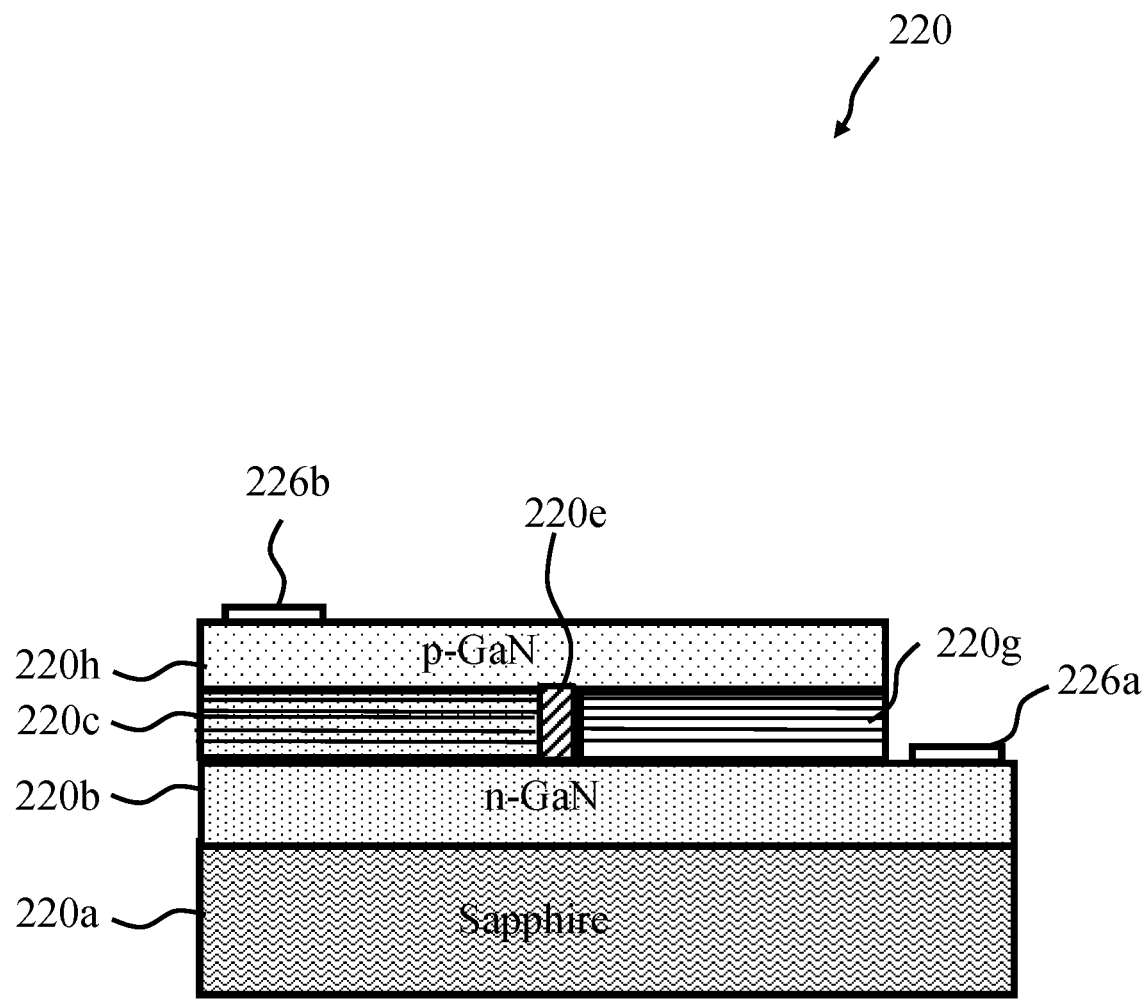
Figure 2C:
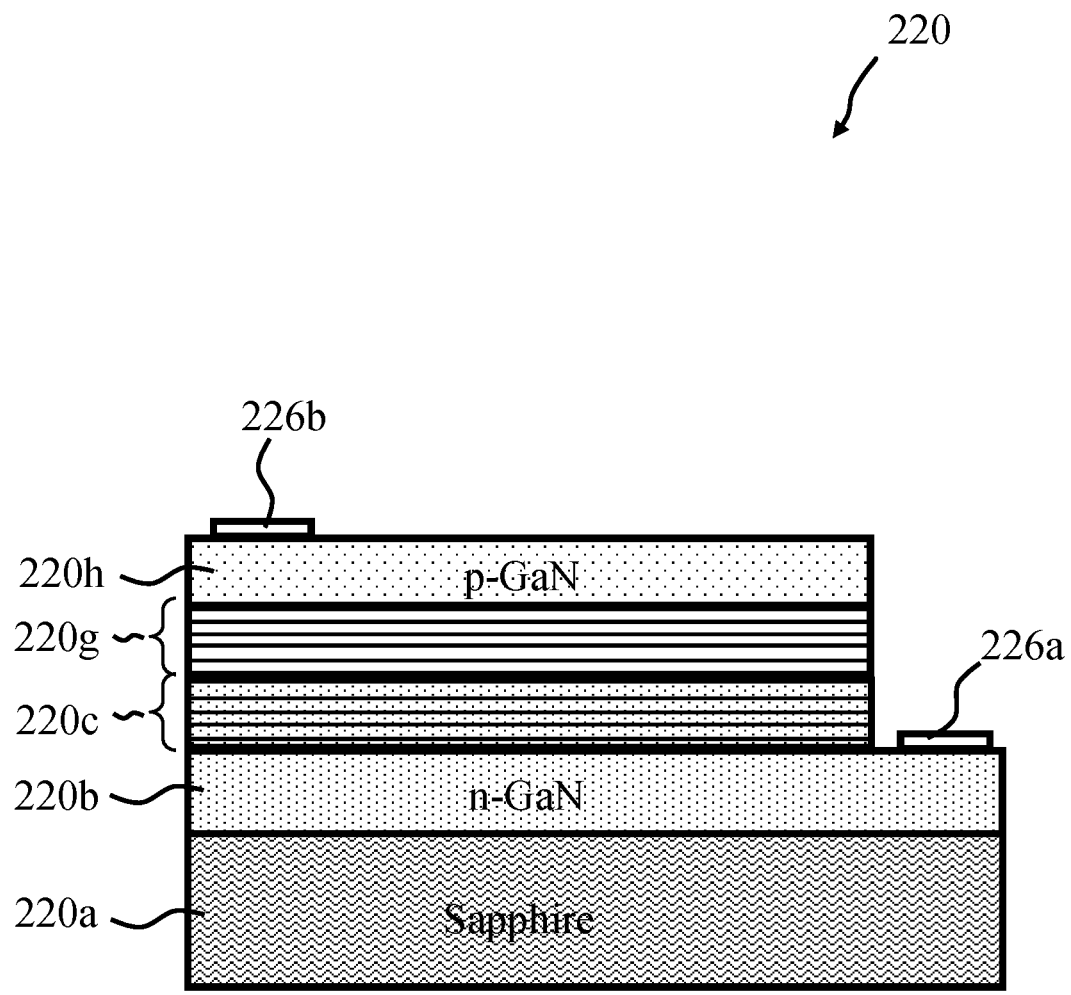

FIGS. 2A, 2B and 2C are schematic representations of MQW example dual-wavelength LED structures that can be used in the present invention. It will be appreciated that other suitable MQW LED structures exist that are suitable for use in the invention. FIGS. 2A and 2B can be referred to as monolithic devices in that they essentially comprise respective blue and green MQW LED structures fabricated as a single chip, while FIG. 2C comprises a single MQW LED structure that is capable of generating blue and green light.

Referring to FIG. 2A the LED chip 220 comprises a layered-structure comprising, in order: a sapphire substrate 220a, a first n-doped GaN (n-GaN) layer 220b, a second InGaN MQW structure layer 220c for generating green light of dominant wavelength $\lambda_{d2}$, a first p-doped GaN (p-GaN) layer 220d, a barrier layer 220e, a second n-doped GaN (n-GaN) layer 220f, a first InGaN MQW structure layer 220g for generating blue light of dominant wavelength $\lambda_{d1}$, and a second p-doped GaN (p-GaN) layer 220h. The n-electrode 226a and p-electrode 226b are electrically connected to the first n-GaN layer 220b and second p-GaN layer 220h respectively. The dominant wavelength $\lambda_d$ of light generated by the MQW structures 220c and 220g can depend on the indium (In) doping of the QWs, QW layer width and number and dominant wavelength $\lambda_d$ spacing of the QWs. It will be appreciated that the structure comprising layers 220b to 220d constitute a respective green MQW LED structure (p-n junction diode) that generates green light, while the structure comprising layers 220f to 220h constitute a respective blue MQW LED structure that generates blue light. The green and blue MQW LED structures are electrically connected in series. Depending on application, the number and dominant wavelength $\lambda_d$ spacing of the blue (first) and green (second) QWs can be configured to generate blue light and/or green light with a Full Width at Half Maximum (FWHM) emission intensity from about 15 nm to about 45 nm. For example, in general lighting applications, the blue and/or green light will generally have a broader FWHM emission intensity, for example, from about 25 nm to about 645 nm. In display backlight applications, the blue light and/or green light will generally have a narrower FWHM emission intensity, for example, from about 15 nm to about 25 nm.

In the arrangement of FIG. 2A, the blue (first) and green (second) MQW layers 220g and 220c are stacked on one another in a vertical arrangement. In other embodiments, the blue and green QWs can be laterally located within a single layer. Referring to FIG. 2B the LED chip 220 comprises a layered-structure comprising, in order: a sapphire substrate 220a, an n-doped GaN (n-GaN) layer 220b, first and second InGaN MQW structures 220g, 220c for respectively generating blue light of dominant wavelength $\lambda_{d1}$ and green light of dominant wavelength $\lambda_{d2}$ and a p-doped GaN (p-GaN) layer 220h. As indicated in FIG. 2B, the first and second MQW structures 220g, 220c are laterally located in a single layer and can be separated by a barrier layer 220e. The n-electrode 126a and p-electrode 126b are electrically connected to the n-GaN layer 220b and p-GaN layer 220h respectively. It will be appreciated that the structure comprising layers 220b, 220g and 220h constitutes a respective blue MQW LED structure (p-n junction diode) that generates blue light, while the structure comprising layers 220b, 220c and 220h constitutes a respective green MQW LED structure that generates green light. The blue and green MQW LED structures are electrically connected in parallel. The dominant wavelength $\lambda_d$ of light generated by the blue and green MQW structures can depend on the indium (In) doping, QW layer width and number and dominant wavelength $\lambda_d$ spacing of the QWs. Depending on application, the number and dominant wavelength $\lambda_d$ spacing of the blue (first) and green (second) QWs can be configured to generate blue light and/or green light with a Full Width at Half Maximum (FWHM) emission intensity from about 15 nm to about 45 nm. For example, in general lighting applications, the blue and/or green light will generally have a broader FWHM emission intensity, for example, from about 25 nm to about 45 nm. In display backlight applications, the blue light and/or green light will generally have a narrower FWHM emission intensity, for example, from about 15 nm to about 25 nm.

FIG. 2C is a schematic of a single MQW LED structure that is capable of generating both blue and green light. Referring to FIG. 2C the LED chip 220 comprises a layered-structure comprising, in order: a sapphire substrate 220a, an n-doped GaN (n-GaN) layer 220b, a second InGaN MQW structure layer 220c for generating green light of dominant wavelength $\lambda_{d2}$, a first InGaN MQW structure layer 220g for generating blue light of dominant wavelength $\lambda_{d1}$ and a-doped GaN (p-GaN) layer 220h. The n-electrode 226a and p-electrode 226b are electrically connected to the n-GaN layer 220b and p-GaN layer 220h respectively. The dominant wavelength $\lambda_d$ of light generated by the blue and green MQW structures can depend on the indium (In) doping of the QWs, QW layer width and number and dominant wavelength $\lambda_d$ spacing of the QWs. It will be appreciated that the structure comprising layers 220b, 220c, 220g and 220h constitute a single MQW LED structure (p-n junction diode) that generates both blue and green light. Depending on application, the number and dominant wavelength $\lambda_d$ spacing of the blue (first) and green (second) QWs can be configured to generate blue light and/or green light with a Full Width at Half Maximum (FWHM) emission intensity from about 15 nm to about 60 nm. For example, in general lighting applications, the blue and/or green light will generally have a broader FWHM emission intensity, for example, from about 25 nm to about 60 nm. In display backlight applications, the blue light and/or green light will generally have a narrower FWHM emission intensity, for example, from about 15 nm to about 25 nm. As illustrated, the green (second) MQW structure 220c can be disposed adjacent the n-GaN layer 220b and the blue (first) InGaN MQW structure layer 220g disposed on top of the blue InGaN structure layer 220g and located adjacent to the p-GaN layer 220h. In other configurations, the position of the blue and green MQW structure layers can be transposed with the blue (first) MQW structure 220g located adjacent the n-GaN layer 220b and the green (second) MQW structure layer 220c located adjacent the p-GaN layer 220h. Moreover, while the MQW structure layers 220c and 220g are illustrated as comprising respective MQW structures stacked on one another the first and second MQWs can be integrated as a single structure, for example a single MQW structure layer comprising a stack of interposed (for example alternating) blue and green QWs.

Referring to FIG. 1, in operation, a proportion of the blue light from the dual-wavelength LED die 120 is converted to red light by the photoluminescence material in the photoluminescence layer 122. The combination of the green light generated by the dual-wavelength LED die(s) 120, red light generated by photoluminescence material and unconverted blue light generated by the dual-wavelength LED die(s) generates a white light emission product. Depending on the excitation spectra (characteristic) of the photoluminescence material, it is possible that a proportion of the green light generated by the dual-wavelength LED die may also be converted by the photoluminescence material to red light.

Figure 3A:
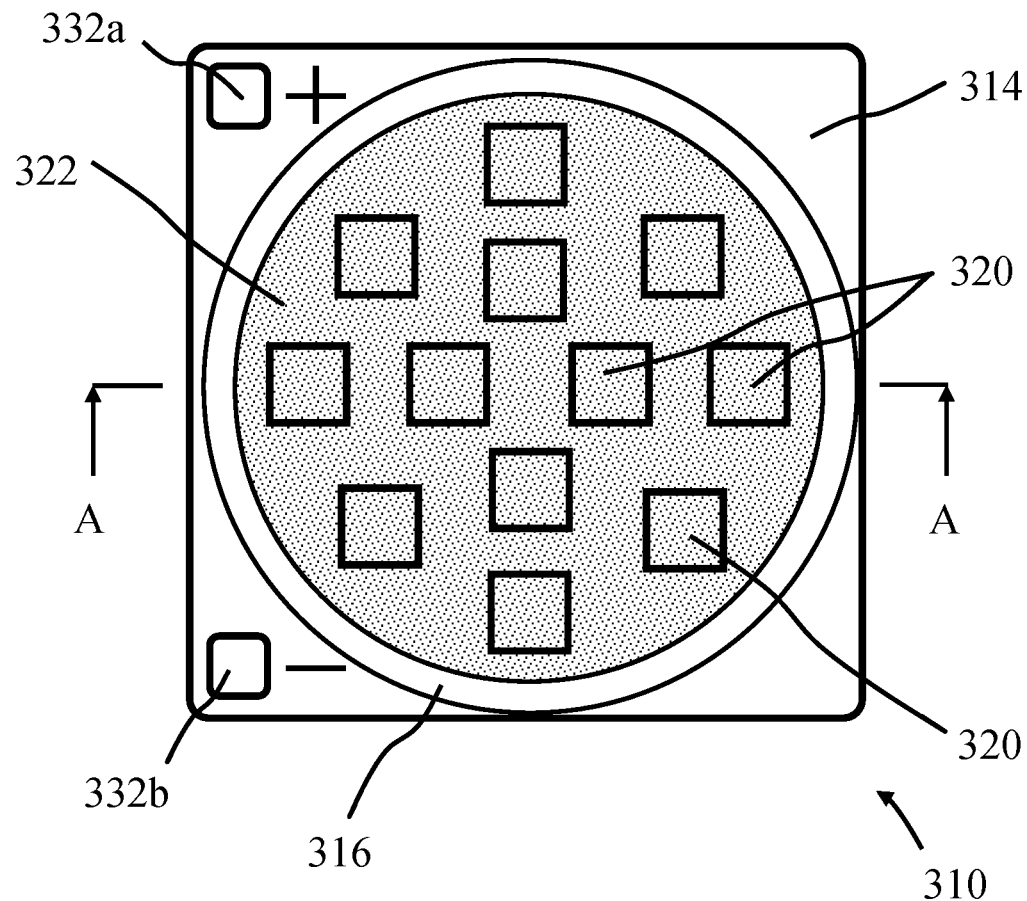
FIGS. 3A and 3B are respectively (a) a plan view and (b) sectional side view through A-A of a Chip On Board (COB) packaged white light emitting device in accordance with an embodiment of the invention.
Figure 3B:
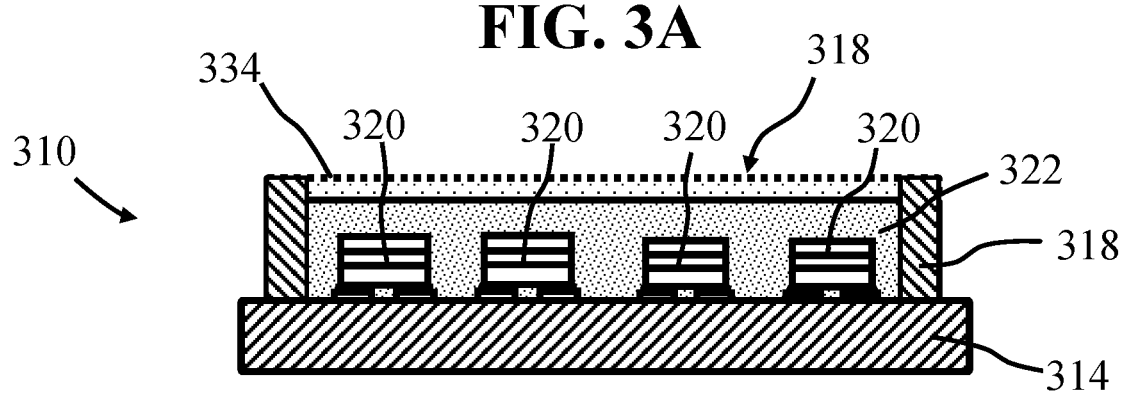

A Chip On Board (COB) packaged white light emitting device 310 in accordance with an embodiment of the invention 310 will now be described with reference to FIGS. 3A and 3B. The device 310 comprises multiple (twelve) MQW dual-wavelength LEDs dies 320 disposed on a substrate 314, and a photoluminescence material 322 disposed over the LEDs dies 320. More particularly, FIG. 3A shows a plan view of the COB white light emitting device 310, and FIG. 3B, shows a sectional side view through A-A (of FIG. 3A). The substrate 314 is planar and square in shape and can be a metal core printed circuit board (MCPCB). The twelve dual-wavelength LED dies 320 are evenly distributed on the substrate 314 in the form of a circular array. The device 310 comprises about the entire perimeter of the substrate 314, an annular wall 316 which encloses the array of LED dies 320 and in conjunction with the surface of the substrate 314 defines a circular cavity 318. The LED dies 320 are operable to generate blue light having a dominant wavelength $\lambda_{d1}$ from 440 nm to 470 nm and green light having a dominant wavelength $\lambda_{d2}$ from 520 nm to 540 nm.

A red photoluminescence material 322 is deposited onto the substrate 314 inside the wall 316 to completely cover the LED dies 320 and to fill the cavity 318. The red photoluminescence material 322 is operable to generate red light having a peak emission wavelength $\lambda_{pe}$ from 620 nm to 660 nm.

In operation, a proportion of the blue light generated by the LED dies 320 is converted to red light by the photoluminescence material. The combination of the green light generated by the LED dies 320, red light generated by photoluminescence material and unconverted blue light generated by the LED dies generates a white light emission product.

Optionally, the white light emitting device 310 may comprise a diffusing layer 334 (indicated by a dashed line in FIG. 3B). The diffusing layer may improve the color uniformity of light emission by the white light emitting device 310. The diffusing layer may be in direct contact with the photoluminescence material 322. It may be that the diffusing layer comprises a light transmissive material and light scattering particles. Enhanced color uniformity can be particularly advantageous when the device is used in large beam optics. The diffusing layer comprising light scattering particles increases the probability that a photon will result in the generation of photoluminescence light by directing blue excitation light back into the photoluminescence material 322. Thus, the amount of photoluminescence material required to generate a given color temperature of light can be reduced since more of the blue excitation light is converted to photoluminescence light owing to the diffusing layer. Moreover, reducing the amount of photoluminescence material provides a more cost-effective manner of manufacturing the white light emitting device 310 especially when using an expensive manganese-activated fluoride phosphor such as KSF.

Figure 4:
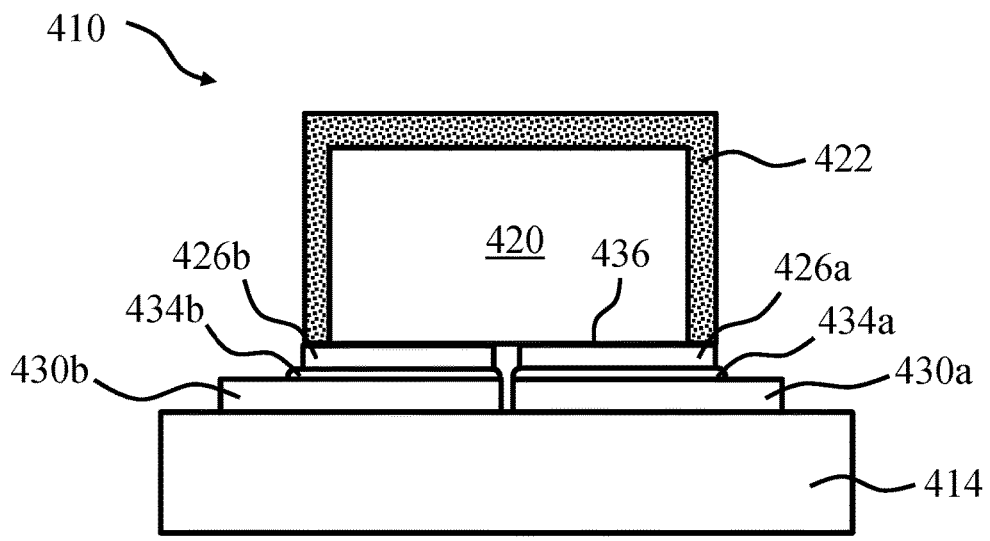
FIG. 4 is a schematic representation of a Chip Scale Package (CSP) white light emitting device in accordance with an embodiment of the invention utilizing a flip-chip dual-wavelength LED die.

Referring now to FIG. 4, there is shown a schematic representation of a Chip Scale Package (CSP) white light emitting device in accordance with an embodiment of the invention utilizing a flip-chip LED die 420.

The CSP white light emitting device 410 comprises a MQW dual-wavelength LED flip-chip LED die 420 having an red photoluminescence material coating layer 422 on each of its light emitting faces (typically the top and four side faces). The LED die 422 is operable to generate blue light having a dominant wavelength $\lambda_{d1}$ from 440 nm to 470 nm and green light having a dominant wavelength $\lambda_{d2}$ from 520 nm to 540 nm. The red photoluminescence material 422 generates red light having a peak emission wavelength $\lambda_{pe}$ from 620 nm to 640 nm. The LED die 420 comprises an n-electrode 426a and a p-electrode 426b at its base 436. The n-electrode 426a and a p-electrode 426b are electrically connected by flip-chip bonding 434a and 434b to two corresponding bonding pads 430a, 430b. The contact pads 430a, 430b are mounted on the planar substrate 414.

Figure 5:
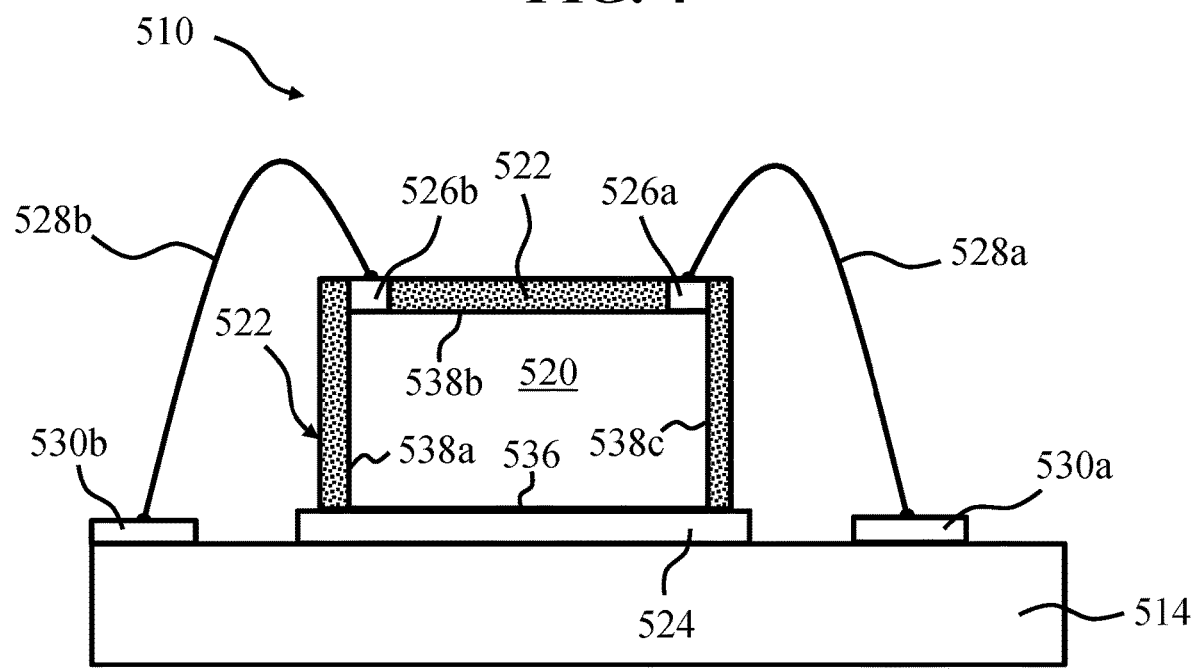
FIG. 5 is a schematic representation of a Chip Scale Packaged (CSP) white light emitting device in accordance with an embodiment of the invention utilizing a lateral-chip dual-wavelength LED die.

Referring to FIG. 5, there is shown a schematic representation of a CSP white light emitting device in accordance with an embodiment of the invention utilizing a lateral-chip dual-wavelength LED die 520.

The light emitting device 510 comprises a MQW dual-wavelength LED die 520 coated with a red photoluminescence material 522 on its upper 538b and all side surfaces 538a, 538c. The LED die 520 has a bonding pad 524 on its base 536. The LED die 520 comprises a MQW structure and is operable to generate blue light having a dominant wavelength $\lambda_{d1}$ from 440 nm to 470 nm and green light having a dominant wavelength $\lambda_{d2}$ from 520 nm to 540 nm. The red photoluminescence material 522 generate red light having a peak emission wavelength $\lambda_{pe}$ from 620 nm to 640 nm. The LED die 520 comprises an n-electrode 526a and a p-electrode 526b on opposing ends of its upper surface 538b. Bond wires 528a, 528b connect the n-electrode 524a and the p-electrode 524b to corresponding contact pads 530a, 530b which are mounted on a planar substrate 514.

Figure 6:
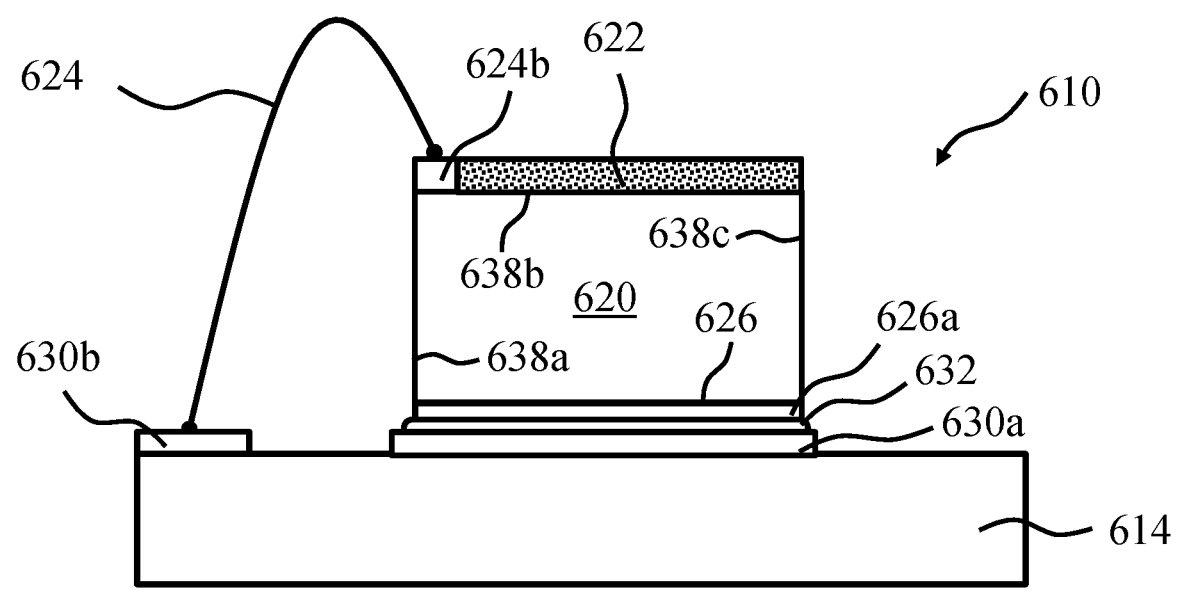
FIG. 6 is a schematic representation of a Chip Scale Packaged (CSP) white light emitting device in accordance with an embodiment of the invention utilizing a vertical-chip dual-wavelength LED die.

Referring to FIG. 6, there is shown a schematic representation of a CSP white light emitting device in accordance with an embodiment of the invention utilizing a vertical-chip dual-wavelength LED die 620.

The light emitting device 610 comprises a MQW dual-wavelength LED vertical-chip LED die 620 coated with red photoluminescence material(s) 622 on its upper surface 638b only. More particularly, the side surfaces 638a, 638c are not coated with the photoluminescence material(s) since the vertical chip emits light from its upper surface only. The LED die 620 comprises a MQW structure and is operable to generate blue light having a dominant wavelength $\lambda_{d1}$ from 440 nm to 470 nm and green light having a dominant wavelength $\lambda_{d2}$ from 520 nm to 540 nm. The die 620 comprises a n-electrode 626a at its base 626 which is seated on a bonding pad 632. In turn, bonding pad 632 is seated on a contact pad 630a which is mounted on the planar substrate 614. The LED die 620 comprises a p-electrode 624b on one end of its upper surface 638b. A bond wire 624 connects the p-electrode 624b to a corresponding contact pad 630b which is mounted on a planar substrate 614. The red photoluminescence material 622 is operable to generate red light having a peak emission wavelength $\lambda_{pe}$ from 620 nm to 660 nm.

Remote Photoluminescence White Light Emitting Device

As well as packaged white light emitting devices the present invention also finds utility in remote photoluminescence (e.g. remote phosphor) arrangements in which the photoluminescence material comprises a photoluminescence layer located remotely to the LED die. In this patent specification "Remotely" means in a spaced or separated relationship. The separation can be by an air gap or may include a light transmissive medium between the LED die and photoluminescence layer.

Figure 7A:
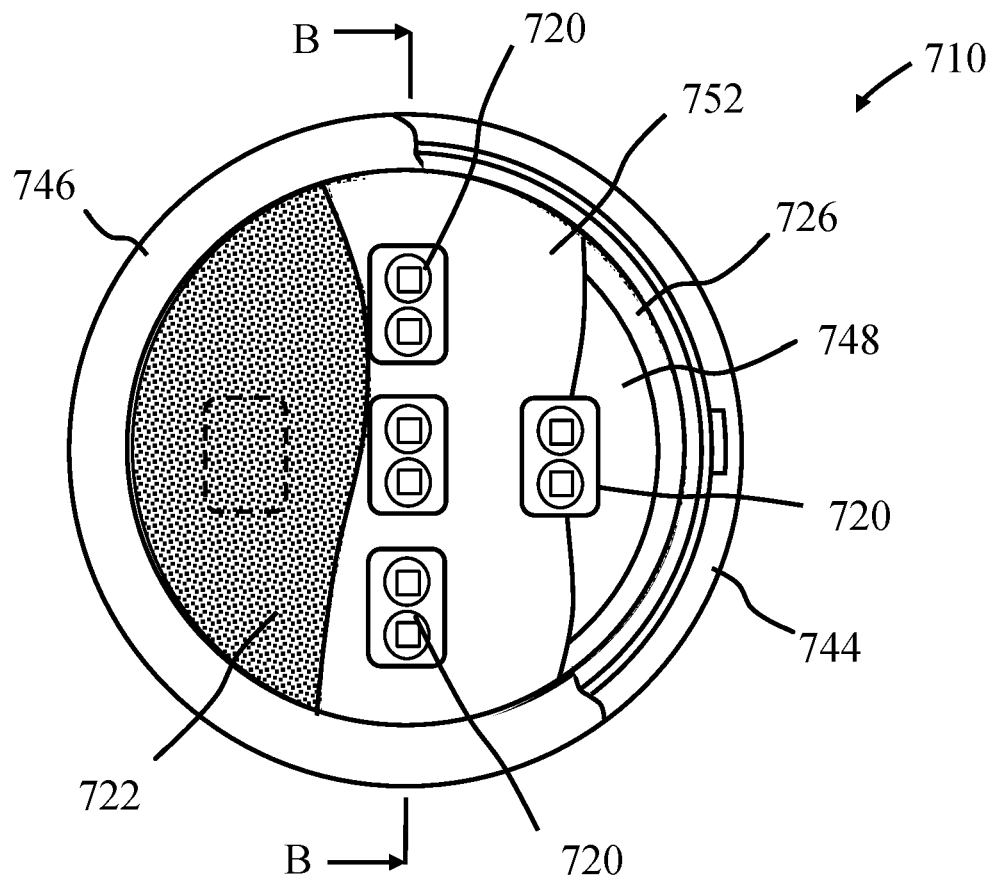
FIGS. 7A and 7B are respectively (a) a plan view and (b) sectional side view through B-B of a remote photoluminescence white light emitting device in accordance with an embodiment of the invention.
Figure 7B:
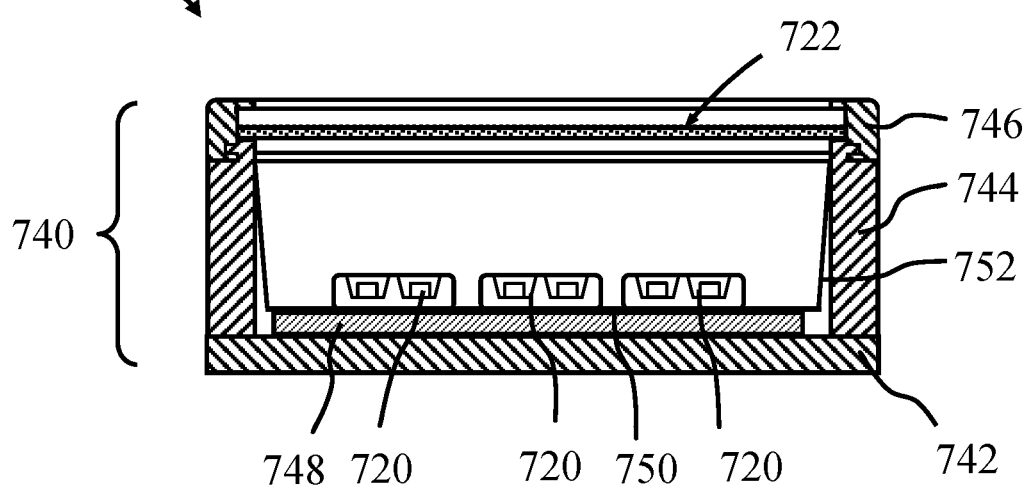

A remote photoluminescence wavelength converted white light emitting device arrangement 710 in accordance with an embodiment of the invention will now be described with reference to FIGS. 7A and 7B. More particularly, FIG. 7A shows a partial sectional plan view of the remote photoluminescence white light emitting device 710, and FIG. 7B, shows a sectional side view through B-B (of FIG. 7A).

The device 710 can be used alone or comprise a part of a downlight or other lighting arrangement. The device 710 comprises a hollow cylindrical body 740 composed of a circular disc-shaped base 742, a hollow cylindrical wall portion 744 and a detachable annular top 746. To aid in the dissipation of heat, the base 742 can be fabricated from aluminum, an alloy of aluminum or any material with a high thermal conductivity.

The device 710 further comprises a plurality (five in the example of FIGS. 1A and 1B) of packaged MQW dual-wavelength LEDs 720 that are mounted in thermal communication with a circular-shaped MCPCB (metal core printed circuit board) 748. To maximize the emission of light, the device 710 can further comprise light reflective surfaces 750 and 752 that respectively cover the face of the MCPCB 748 and the inner curved surface of the cylindrical wall 744. Each one of the LEDs 720 comprises a MQW structure and is operable to generate blue light having a dominant wavelength ($\lambda_{d1}$) from 440 nm to 470 nm and green light having a dominant wavelength from 520 nm to 540 nm.

The device 710 further comprises a photoluminescence wavelength conversion component 722 containing a red photoluminescence material that is located remotely to the LEDs 720 and operable to absorb a portion of the blue/green excitation light generated by the LEDs 720 and convert it to light of a different wavelength by a process of photoluminescence. The red photoluminescence material 722 is operable to generate red light having a peak emission wavelength ($\lambda_{pe}$) from 620 nm to 640 nm. The emission product of the device 710 comprises the combination of blue and green light generated by the LEDs 720 and photoluminescence light generated by the photoluminescence wavelength conversion component 722. The photoluminescence wavelength conversion component may be formed of a light transmissive material (for example, polycarbonate, acrylic material, silicone material, etc.) that incorporates the red photoluminescence material 722. Furthermore, in embodiments, the photoluminescence wavelength conversion component may be formed of a light transmissive substrate that is coated with the red photoluminescence material. The wavelength conversion component 722 is positioned remotely to the LEDs 720 and is spatially separated from the excitation sources. In this patent specification, "remotely" and "remote" means in a spaced or separated relationship. Typically, wavelength conversion component and excitation sources are separated by air, while in other embodiments they can be separated by a suitable light transmissive medium, such as for example a light transmissive silicone or epoxy material. The wavelength conversion component 722 is configured to completely cover the housing opening such that all light emitted by the device passes through the wavelength component 722. As shown, the wavelength conversion component 722 can be detachably mounted to the top of the wall portion 744 using the top 748 enabling the component and emission color of the lamp to be readily changed.

Liquid Crystal Displays and Display Backlights

While the foregoing white light emitting devices may have been described in relation to general lighting applications, devices in accordance with embodiments of the invention find utility as backlights for liquid crystal displays. As described above, for backlight applications the MQW LED dies are configured to generate blue light and/or green light with a narrower FWHM emission intensity, for example, from about 15 nm to about 30 nm or from about 15 nm to about 25 nm. Similarly, the red photoluminescence material can comprise a narrowband material (FWHM emission intensity from about 10 nm to about 30 nm or from about 15 nm to about 25 nm).

Figure 8A:
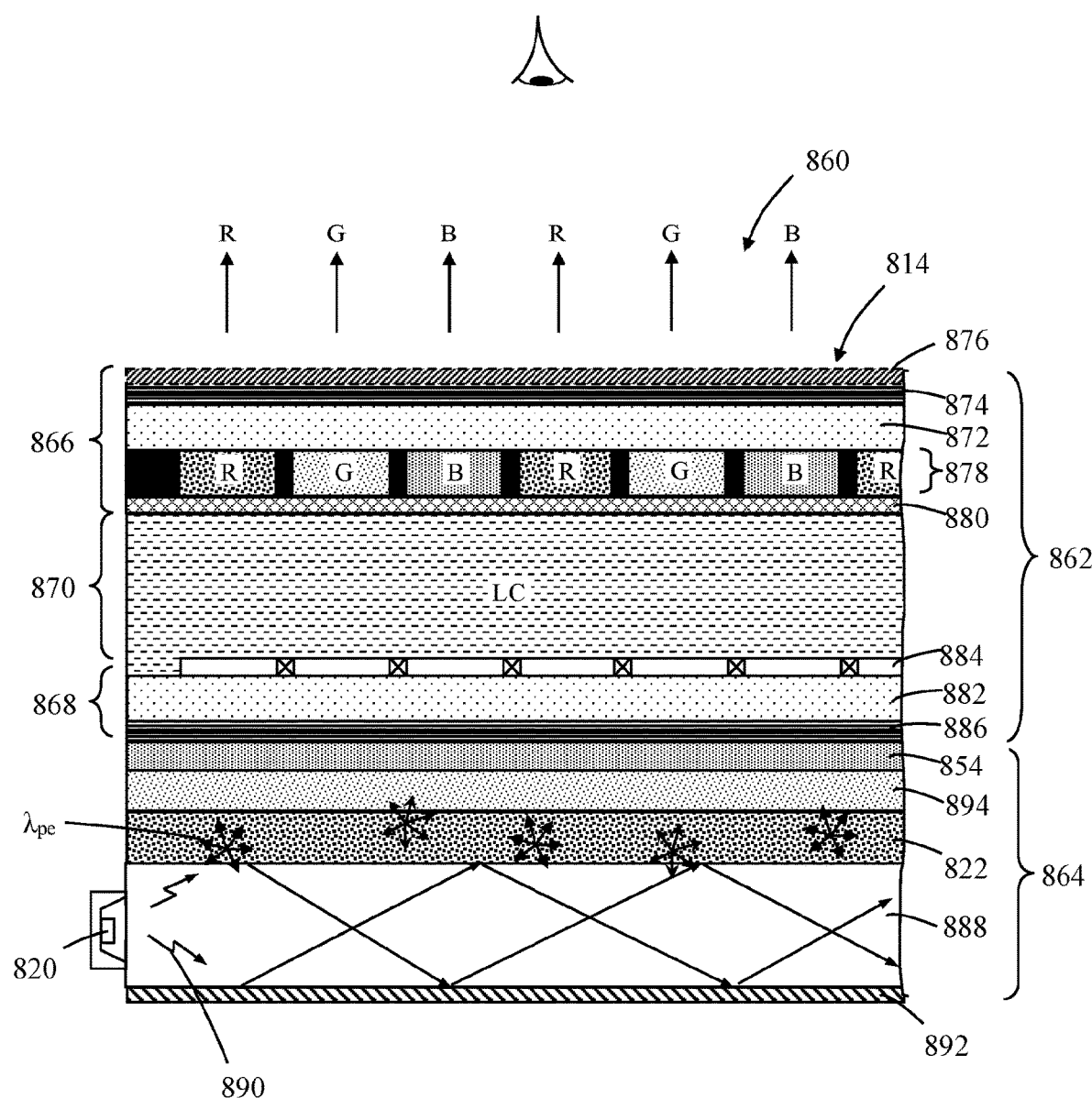
FIGS. 8A and 8B are respectively sectional side views of (a) an edge-lit Liquid Crystal Display in accordance with an embodiment of the invention and (b) a display backlight in accordance with an embodiment of the invention.
Figure 8B:
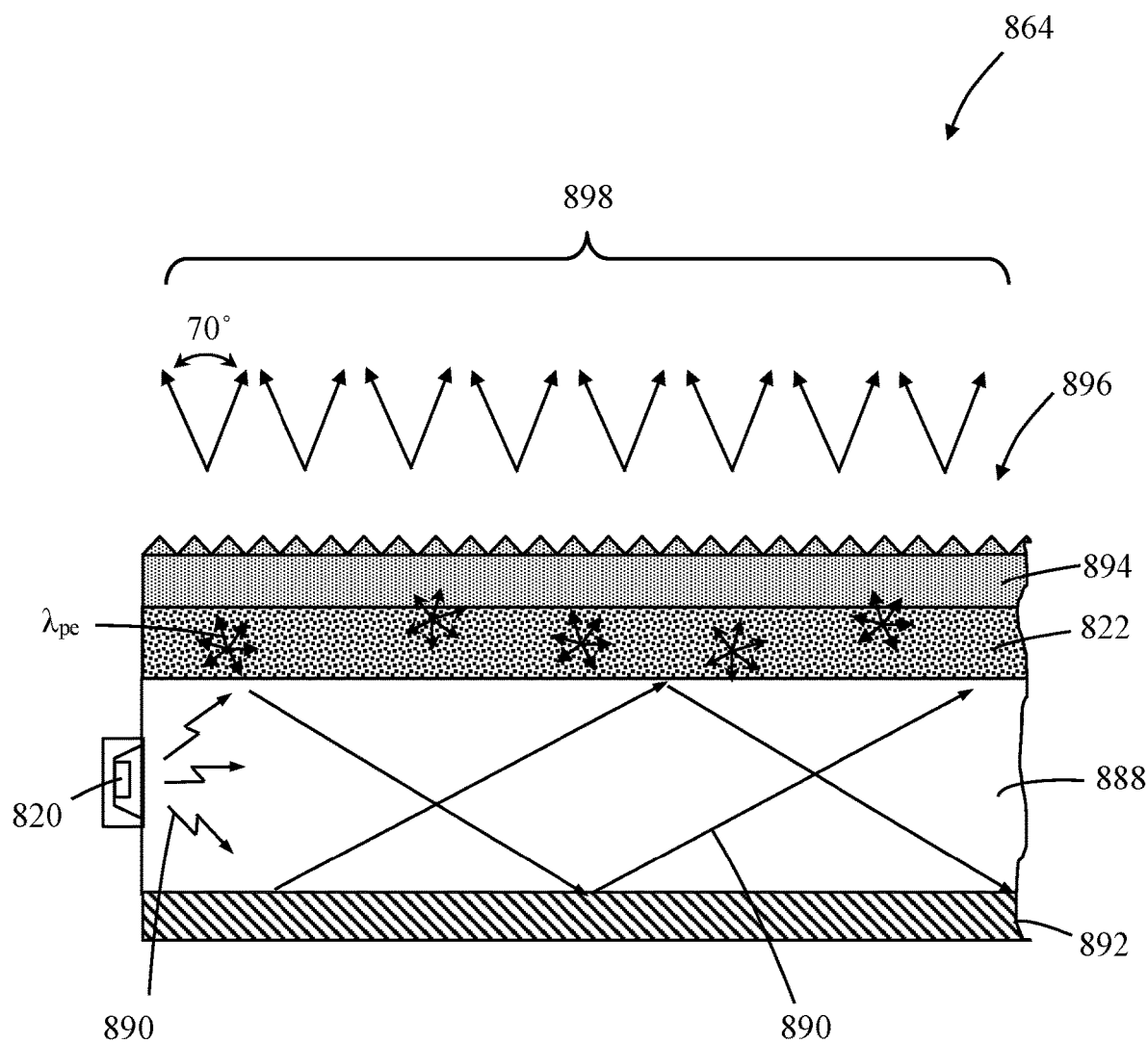

FIGS. 8A and 8B respectively show (a) is a sectional view of a light transmissive edge-lit color Liquid Crystal Display (LCD) 860 and (b) an enlarged sectional view of a display backlight in accordance with an embodiment of the invention. The Color LCD 860 comprises a LC (Liquid Crystal) Display Panel 862 and a Display Backlight 864. The Backlight 864 is operable to generate white light for operating the LC Display Panel 862.

The LC display panel 862 comprises a transparent (light transmissive) Front (light/image emitting) Plate 866, a transparent Back Plate 868 and a Liquid Crystal (LC) 870 filling the volume between the Front and Back Plates 866, 868.

The Front Plate 866 can comprise a glass plate 872 having on its upper surface, that is the face of the plate comprising the viewing face of the display, a first polarizing filter layer (sheet) 874. Optionally, the outermost viewing surface of the front plate can further comprise an anti-reflective layer 876. On its underside, that is the face of the front plate 866 facing the liquid crystal (LC) 870, the glass plate 872 can further comprise a color filter plate 878 and a light transmissive common electrode plane 880 (for example transparent Indium Tin Oxide, ITO).

The color filter plate 878 comprises an array of different color sub-pixels filter elements R, G, B which respectively allow transmission of red (R), green (G), and blue (B) light. Each unit pixel of the display comprises a group of three sub-pixels filter elements R, G, B. Each RGB sub-pixel comprises a respective color filter pigment, typically an organic dye, which allows passage of light corresponding to the color of the sub-pixel only.

The back plate 868 can comprise a glass plate 882 having on its upper surface (the surface facing the LC) a TFT (Thin Film Transistor) layer 884. The TFT layer 884 comprises an array of TFTs, in which there is a transistor corresponding to each individual color sub-pixel R, G, B of each unit pixel. Each TFT is operable to selectively control passage of the light to its corresponding sub-pixel. On a lower surface of the glass plate 882 there is provided a second polarizing filter layer (sheet) 886. The directions of polarization of the two polarizing filters 874 and 886 are aligned orthogonally (perpendicular) to one another.

The Backlight 864 is operable to generate and emit white light from a front light emitting face (upper face that faces the rear of the Display Panel) for operating the LC Display Panel 862. As shown in FIG. 8B, the backlight 864 can comprise an edge-lit arrangement comprising a light guide (waveguide) 888 with one or more packaged MQW dual-wavelength LEDs 820 located along one or more edges of the light guide 888. Each MQW LED 820 is operable to generate blue light having a dominant wavelength ($\lambda_{d1}$) from 440 nm to 470 nm and green light having a dominant wavelength from 500 nm to 540 nm. As indicated, the light guide 888 can be planar; though, in some embodiments, it can be tapered (wedge-shaped) for promoting a more uniform emission of excitation light from a front light emitting face (upper face that faces the Display Panel) of the light guide. The LEDs 820 are configured such that in operation, they generate blue/green excitation light 890 which is coupled into one or more edges of the light guide 888 and then guided, by total internal reflection, throughout the volume of the light guide and finally emitted from the front face (upper face that faces the Display Panel 862) of the light guide 888. As shown in FIG. 8B, and to prevent the escape of light from the backlight 864, the rear face (lower face as shown) of the light guide 888 can comprise a light reflective layer (surface) 892 such as Vikuiti™ ESR (Enhanced Spectral Reflector) film from 3M™.

On a front light emitting face (upper face as shown) of the light guide 888 there is provided a photoluminescence wavelength converting layer 822 and a Brightness Enhancement Film (BEF) 894. In embodiments, the photoluminescence layer can comprise a separate sheet/film or a layer that is deposited on, for example, the BEF 894 or light guide 888. In accordance with embodiments of the invention, the photoluminescence layer comprises a red photoluminescence material that generates red light having a peak emission wavelength ($\lambda_{pe}$) from 620 nm to 640 nm. It will be appreciated that since the photoluminescence material is provided in a separate respective layer 822 that is separate from, remote to, the LEDs 820 the backlight constitutes a remote photoluminescence arrangement in which the excitation source and photoluminescence material are separated by an optical medium (light guide 888). In operation, the photoluminescence layer 822 converts a proportion of the blue excitation light (possibly also green light depending on the excitation spectra of the photoluminescence material) into white light 898 for operating the LC Display Panel 862. To optimize the efficacy and color gamut of the display, the dominant wavelength of the blue light $\lambda_{d1}$ and green light $\lambda_{d2}$ and peak emission wavelength $\lambda_{pe}$ of the red photoluminescence material are selected to substantially correspond with the maximum transmission characteristic of their corresponding color filter elements RGB.

The Brightness Enhancement Film (BEF), also known as a Prism Sheet, comprises a precision micro-structured optical film and controls the emission of light from the backlight within a fixed angle (typically 70 degrees), thereby increasing luminous efficacy of the backlight. Typically, the BEF comprises an array of micro-prisms on a light emitting face of the film and can increase brightness by 40-60%. The BEF 894 can comprise a single BEF or a combination of multiple BEFs and in the case of the latter even greater increases in brightness can be achieved. Examples of suitable BEFs include Vikuiti™ BEF II from 3M™ or prism sheets from MNTech. In some embodiments, the BEF 894 can comprise a Multi-Functional Prism Sheet (MFPS) that integrates a prism sheet with a diffusion film and can have a better luminous efficiency than a normal prism sheet. In some embodiments, the BEF 894 can comprise a Micro-Lens Film Prism Sheet (MLFPS) such as those available from MNTech.

Figure 9:
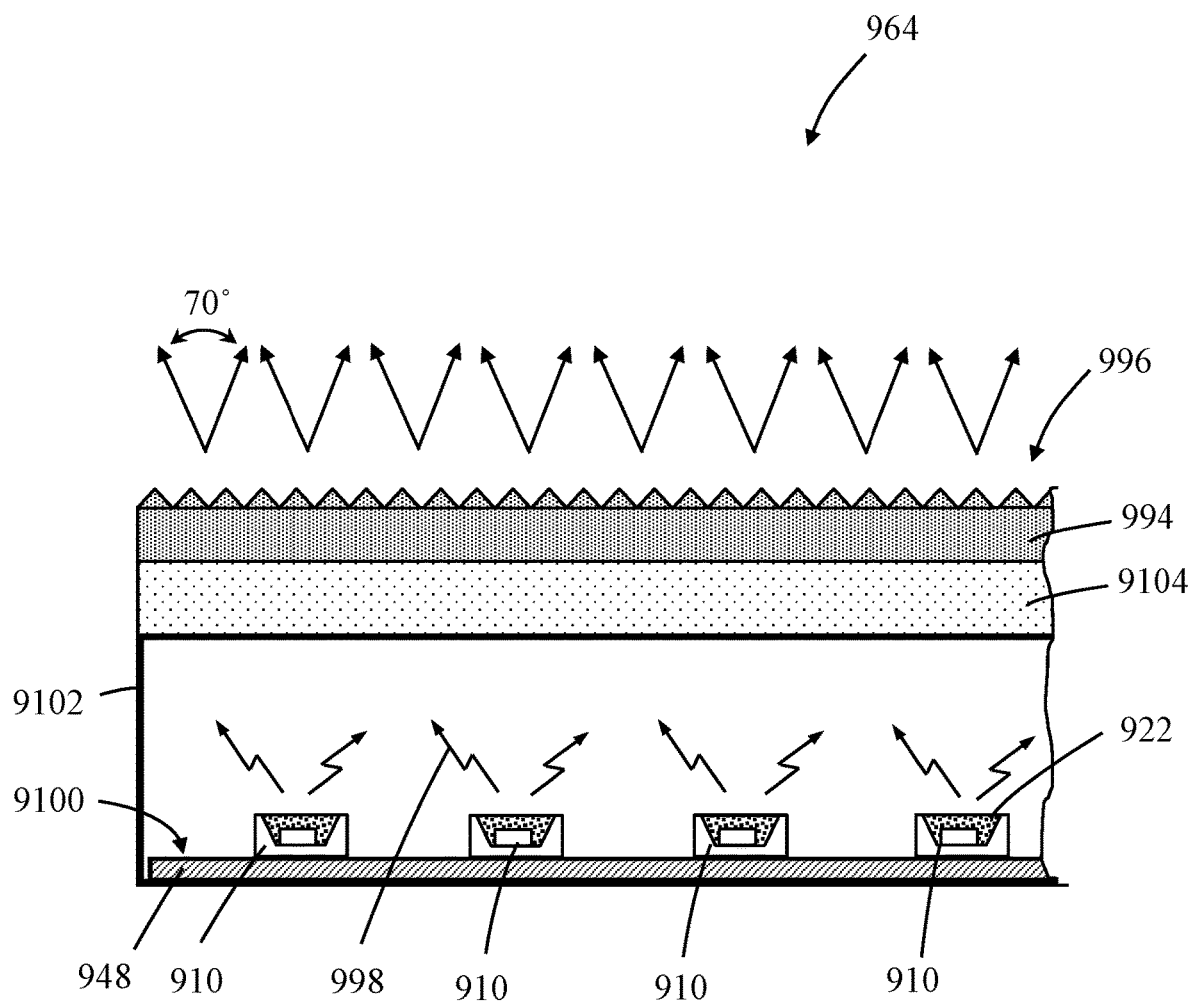
FIG. 9 is a schematic sectional representation of a direct-lit backlight in accordance with an embodiment of the invention.

While in the foregoing embodiment the backlight has been an edge-lit arrangement utilizing a light guide to distribute light across the entire area of the display, various embodiments of the invention find utility in direct-lit backlights in which an array of LEDs is configured over the surface of the LC display panel. FIG. 9 illustrates a direct-lit backlight arrangement 964 in which an array of packaged light emitting devices 910, for example the packaged light emitting devices of FIGS. 1 to 6, are provided on the floor 9100 of a light reflective enclosure 9102. Typically the light emitting devices are mounted on a MCPCB 948 shown). As illustrated, the light emitting devices 910 can comprise the packaged arrangement of FIG. 1. To ensure a uniform illumination of the display panel the backlight can further comprise a light diffusive layer (diffuser) 9104 disposed between the light reflective enclosure 9102 and BEF 994.

Figure 10:
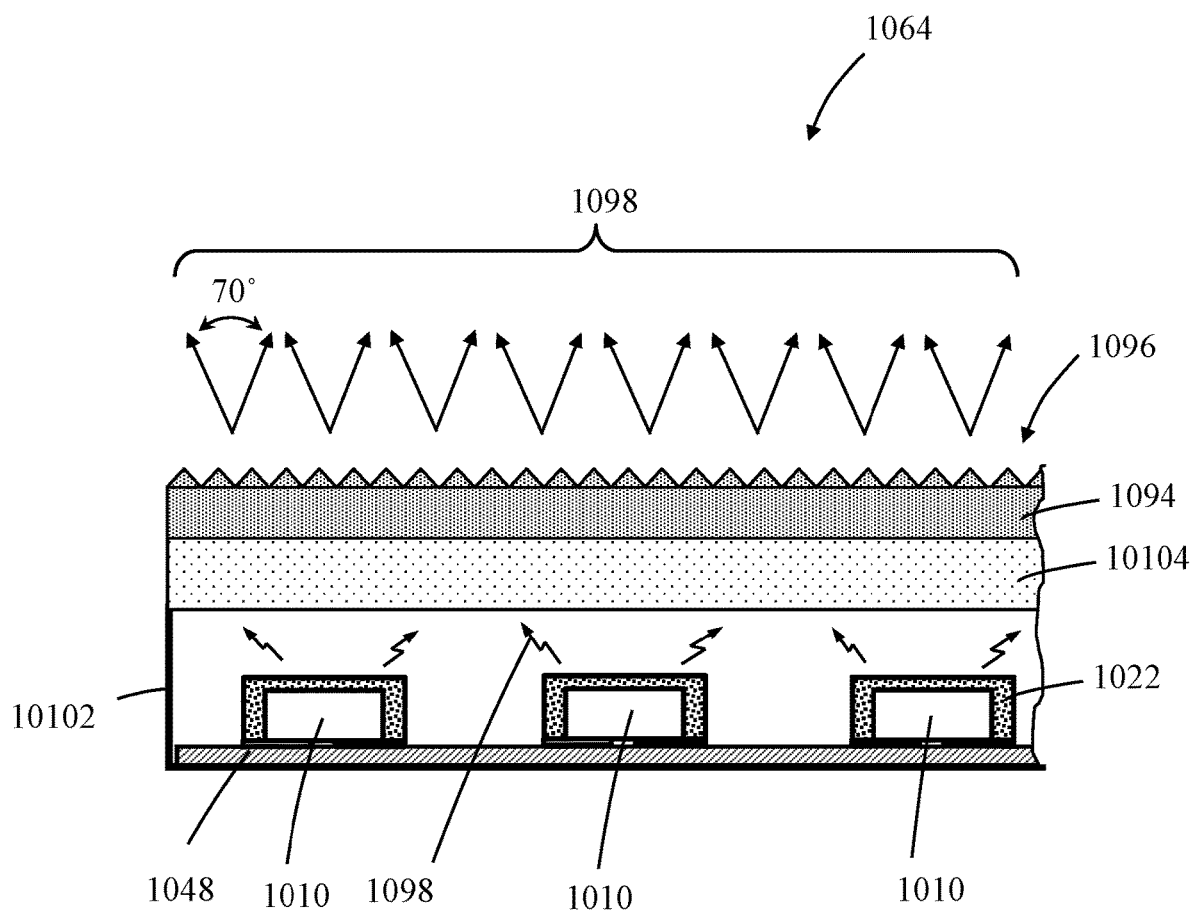
FIG. 10 is a schematic sectional representation of a direct-lit backlight in accordance with an embodiment of the invention.

FIG. 10 is a schematic sectional representation of a further direct-lit backlight 1064 in accordance with an embodiment of the invention. In this embodiment, an array of CSP packaged light emitting devices 1010 are provided on a MCPCB 1048 on the floor of the light reflective enclosure 10100. As illustrated, the light emitting devices 1010 can comprise the CSP packaged arrangement, of FIG. 4. The light emitting devices are configured as an array and cover the entire surface area of the display. To ensure a uniform illumination of the display panel the backlight can further comprise a light diffusive layer (diffuser) 10104 disposed between the light reflective enclosure 10100 and BEF 1094.

Figure 11:
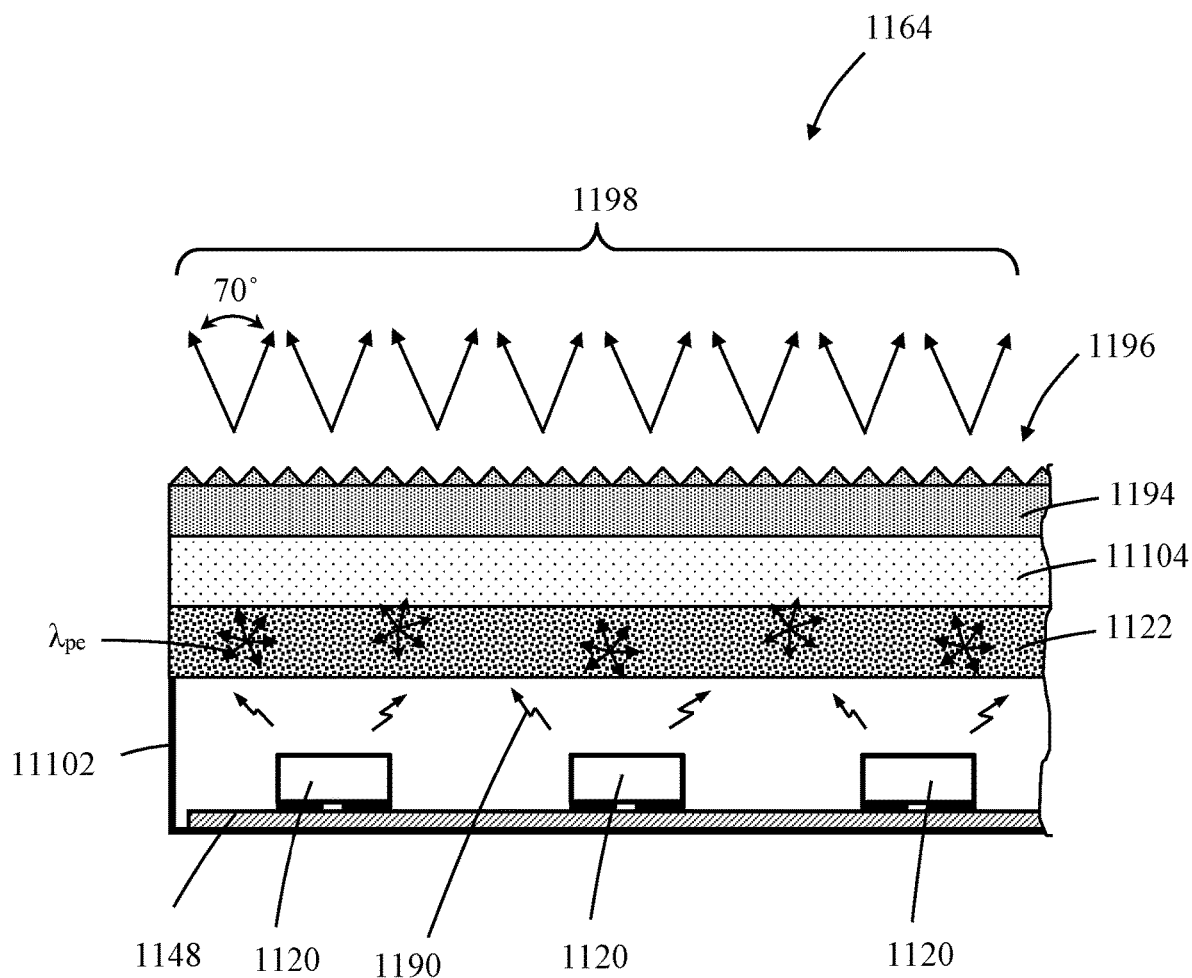
FIG. 11 is a schematic sectional representation of a direct-lit backlight utilizing a remote phosphor film in accordance with an embodiment of the invention.

FIG. 11 is a schematic sectional representation of a further direct-lit backlight in accordance with an embodiment of the invention. In this embodiment, the photoluminescence material is provided as a layer 1122 (phosphor film) that is located remotely to the MQW dual-wavelength LEDs 1120. An array of MQW dual-wavelength LEDs chips 1120, for example LED flip chips, are provided on a MCPCB 1148 on the floor of a light reflective enclosure 11102. The MQW dual-wavelength LEDs chips 1120 are configured as an array and cover the entire surface area of the display. As illustrated the photoluminescence material layer 1122 can be disposed to cover the light reflective enclosure 11102. To ensure a uniform illumination of the display panel the backlight can further comprise a light diffusive layer (diffuser) 11104 disposed between the photoluminescence layer 1122 and BEF 1194. A particular advantage of locating the photoluminescence material in a separate remote layer 1122 is that it enables the use of very small "micro" LED flip-chips which due to their small dimensions would otherwise be difficult or impossible to individually coat with the red photoluminescence material. Typically micro LED chips are of dimension 50 µm or smaller.

Red Photoluminescence Materials

In embodiments of the invention, the red photoluminescence material can comprise any narrowband or broadband red photoluminescence material that is excitable by at least blue light and operable to emit light with a peak emission wavelength ($\lambda_{pe}$) from about 620 nm to about 660 nm, that is in the red region of the visible spectrum and which has a full width at half maximum (FWHM) emission intensity of greater than about 5 nm and less than about 80 nm. Typically, the red photoluminescence material comprises a phosphor in particulate form, and may include for example a narrowband manganese-activated fluoride phosphor, a narrowband europium-activated Group IIA/IIB selenide sulfide-based phosphors, or in the case of general lighting a broadband red phosphor such as a europium-activated silicon nitride-based phosphor. Alternatively, the red photoluminescence material can comprise a quantum dot material.

Narrowband Red Photoluminescence Materials

In this patent specification, a narrowband red photoluminescence material refers to a material which generates red light having a peak emission wavelength ($\lambda_{pe}$) from 620 nm to 640 nm and a full width at half maximum emission intensity from about 5 nm to about 60 nm. The narrowband red photoluminescence material can comprise a phosphor and/or a Quantum Dot (QD) material.

Narrowband Red Phosphors: Manganese-Activated Fluoride Phosphors

Figure 12:
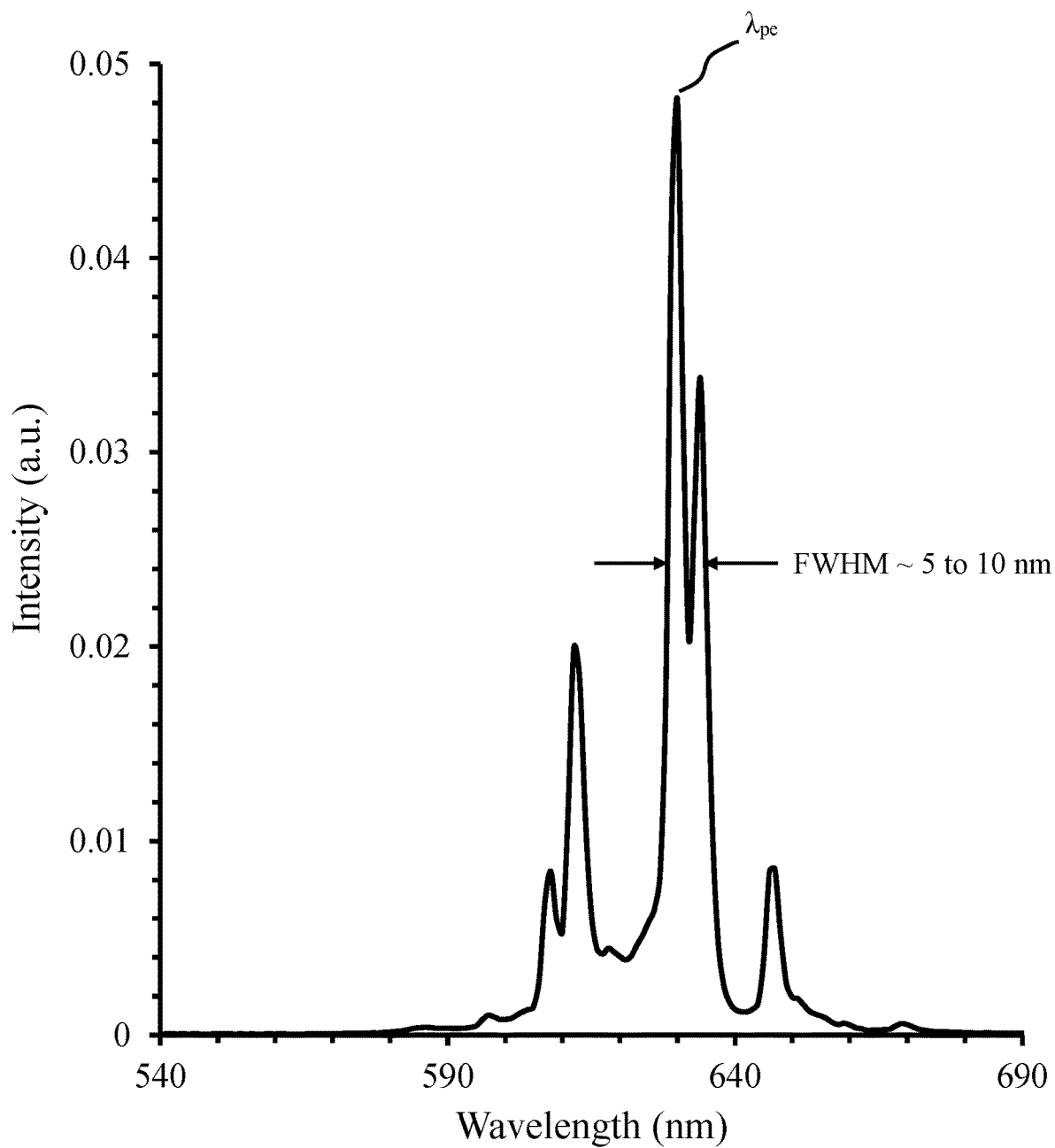
FIG. 12 shows the emission spectrum of manganese-activated potassium hexafluorosilicate phosphor (KSF) of general composition $K_2SiF_6:Mn^{4+}$.

Narrowband red phosphors can include manganese-activated fluoride phosphors. An example of a manganese-activated fluoride phosphor is manganese-activated potassium hexafluorosilicate phosphor (KSF) of general composition $K_2SiF_6:Mn^{4+}$. An example of such a phosphor is NR6931 KSF phosphor from Intematix Corporation, Fremont California, USA which has a peak emission wavelength ($\lambda_{pe}$) of about 632 nm. FIG. 12 shows the emission spectrum of NR6931 KSF phosphor. KSF phosphor is excitable by blue excitation light and generates red light with a peak emission wavelength ($\lambda_{pe}$) of from about 631 nm to about 632 nm with a FWHM of ~5 nm to ~10 nm (depending on the way it is measured: i.e. whether the width takes account of the main emission peak or the main and satellite emission peaks—double peaks—FIG. 12). Other manganese-activated phosphors can include: $K_2GeF_6:Mn^{4+}$, $K_2TiF_6:Mn^{4+}$, $K_2SnF_6:Mn^{4+}$, $Na_2TiF_6:Mn^{4+}$, $Na_2ZrF_6:Mn^{4+}$, $Cs_2SiF_6:Mn^{4+}$, $Cs_2TiF_6:Mn^{4+}$, $Rb_2SiF_6:Mn^{4+}$, $Rb_2TiF_6:Mn^{4+}$, $K_3ZrF_7:Mn^{4+}$, $K_3NbF_7:Mn^{4+}$, $K_3TaF_7:Mn^{4+}$, $K_3GdF_6:Mn^{4+}$, $K_3LaF_6:Mn^{4+}$ and $K_3YF_6:Mn^{4+}$.

Narrowband Red Phosphors: Group IIA/IIB Selenide Sulfide-Based Phosphors

Figure 13:
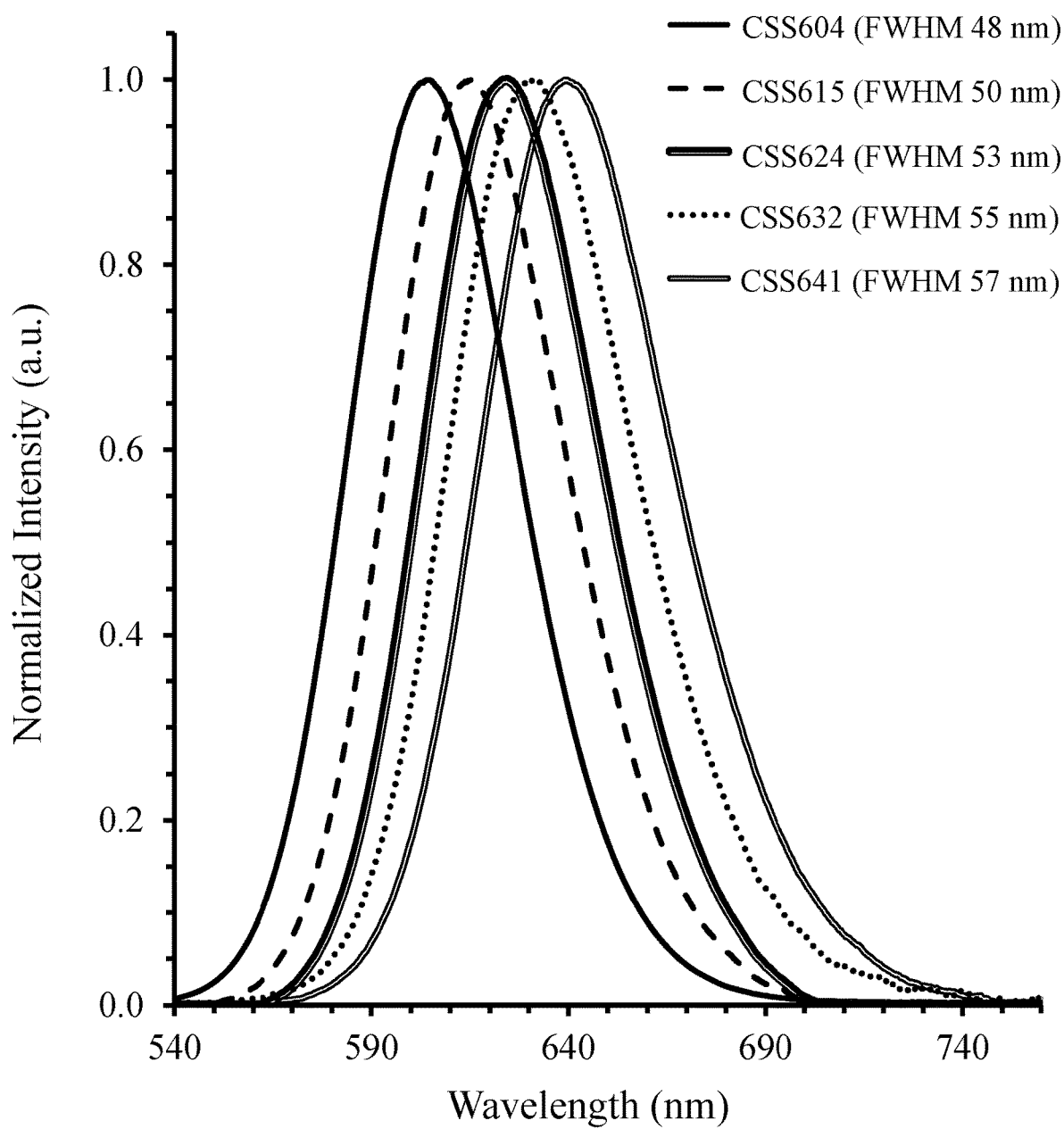
FIG. 13 shows normalized emission spectra of CSS phosphors (denoted CSS604, CSS615, CSS624, CSS632, and CSS641) for differing ratios of S/Se (sulfur/selenium)

Narrowband red phosphors can also include Group IIA/IIB selenide sulfide-based phosphors. A first example of a Group IIA/IIB selenide sulfide-based phosphor material has a general composition $MSe_{1-x}S_x:Eu$, wherein M is at least one of Mg, Ca, Sr, Ba and Zn and $0<x<1.0$. A particular example of this phosphor material is Calcium Selenide Sulfide "CSS" phosphor ($CaSe_{1-x}S_x:Eu$). Details of CSS phosphors are provided in co-pending United States patent application Publication Number US2017/0145309 filed 30 Sep. 2016, which is hereby incorporated by reference in its entirety. The CSS narrow-band red phosphors described in United States patent publication US2017/0145309 can be used in the present invention. FIG. 13 shows normalized emission spectra of CSS phosphors (denoted CSS604, CSS615, CSS624, CSS632, CSS641) for differing ratios of S/Se (sulfur/selenium). In this patent specification, the notation CSS # represents the phosphor type (CSS) followed by the peak emission wavelength in nanometers (#). For example CSS624 denotes a CSS phosphor with a peak emission wavelength $\lambda_{pe}$ of 624 nm. The peak emission wavelength of the CSS phosphor can be tuned from 600 nm to 650 nm by altering the S/Se ratio in the composition and exhibits a narrowband red emission spectrum with FWHM in the range ~48 nm to ~60 nm (longer peak emission wavelength typically has a larger FWHM value). Note that x varies over a range from about 0.05 to about 0.8 for the compositions shown in FIG. 13—the higher peak wavelengths corresponding to the larger values of x; that is, as the amount of S increases this shifts the emission peak to a higher wavelength.

CSS phosphor particles can be synthesized from purified $CaSeO_4$ and $CaSO_4$ in a mild $H_2$ (gas) environment (for example ~5% $H_2/N_2$).

Narrowband Red Phosphors: Coated CSS Phosphors

To improve reliability, the CSS phosphor particles can be coated with one or more oxides, for example: aluminum oxide ($Al_2O_3$), silicon oxide ($SiO_2$), titanium oxide ($TiO_2$), zinc oxide (ZnO), magnesium oxide (MgO), zirconium oxide ($ZrO_2$), boron oxide ($B_2O_3$) or chromium oxide (CrO). Alternatively and/or in addition, the narrow-band red phosphor particles may be coated with one or more fluorides, for example: calcium fluoride ($CaF_2$), magnesium fluoride ($MgF_2$), zinc fluoride ($ZnF_2$), aluminum fluoride ($AlF_3$) or titanium fluoride ($TiF_4$). The coatings may be a single layer, or multiple layers with combinations of the aforesaid coatings. The combination coatings may be coatings with an abrupt transition between the first and second materials, or may be coatings in which there is a gradual/smooth transition from the first material to the second material thus forming a zone with mixed composition that varies through the thickness of the coating.

Details of coating CSS phosphors particles are provided in U.S. Pat. No. 10,253,257 issued 9 Apr. 2019, which is hereby incorporated by reference in its entirety. As described in U.S. Pat. No. 10,253,257, the particles can be coated by a CVD process in a fluidized bed reactor. The thickness of the coating may be a few micrometers. For example, typically, 1 μm to 2 μm.

Coated CSS narrow-band red phosphors are typically coated with approximately 1 μm of amorphous alumina ($Al_2O_3$). In the case of alumina coatings, the coatings comprise a dense amorphous oxide coating layer on the CSS phosphor particle surface without pinholes (pinhole-free) that is a water impermeable coating.

In a typical coating process, the phosphor powder sample was loaded into the reactor and heated to 100-250° C., preferably 200° C., under $N_2$ gas flow. When an oxide coating is to be deposited, a metal organic oxide precursor MO such as TrimethylAluminum (TMA), Titanium tetrachloride ($TiCl_4$), Silicon tetra-chloride ($SiCl_4$), or DimethylZinc (DMZ) was introduced in to the reactor through an inlet with a $N_2$ carrier gas through a bubbler. $H_2O$ vapor was also introduced into the reactor through a further inlet to react with the metal oxide precursor to form oxide coating layers on phosphor particles. Complete fluidization of the particles being coated (from gas flow optimization, etc.) without any dead space is important to ensure homogeneous coating of all phosphor particles. In a typical coating conducted at 200° C., for a 250 g phosphor particle loading of the reactor, the coating was produced with a metal oxide precursor feeding rate of 1 to 10 g/hour for 4 hours, while feeding $H_2O$ at a rate of 2 to 7 g/hour. These conditions can produce dense and pinhole free coatings and these conditions are able to produce dense substantially pin-hole free coatings of uniform thickness, with a theorized percentage solid space (percentage bulk density) of greater than 95%, 97% and 99%. In this patent specification, percentage solid space=(bulk density of the coating/density of the material within a single particle)×100. It will be understood that the percentage solid space (% solid space) provides a measure of the porosity of the coating resulting from pinholes.

Narrowband Red Photoluminescence Materials: Red Quantum Dots (QDs)

A quantum dot (QD) is a portion of matter (e.g. semiconductor) whose excitons are confined in all three spatial dimensions that may be excited by radiation energy to emit light of a particular wavelength or range of wavelengths. The color of light generated by a QD is enabled by the quantum confinement effect associated with the nano-crystal structure of the QD. The energy level of each QD relates directly to the physical size of the QD. For example, the larger QDs, such as red QDs, can absorb and emit photons having a relatively lower energy (i.e. a relatively longer wavelength). On the other hand, blue QDs, which are smaller in size can absorb and emit photons of a relatively higher energy (shorter wavelength). QDs generate light with a FWHM emission intensity from 20 nm to 45 nm.

The QD materials can comprise core/shell nano-crystals containing different materials in an onion-like structure. For example, the above-described exemplary materials can be used as the core materials for the core/shell nano-crystals. The optical properties of the core nano-crystals in one material can be altered by growing an epitaxial-type shell of another material. Depending on the requirements, the core/shell nano-crystals can have a single shell or multiple shells. The shell materials can be chosen based on the band gap engineering. For example, the shell materials can have a band gap larger than the core materials so that the shell of the nano-crystals can separate the surface of the optically active core from its surrounding medium. In the case of the cadmiun-based QDs, e.g. CdSe QDs, the core/shell quantum dots can be synthesized using the formula of CdSe/ZnS, CdSe/CdS, CdSe/ZnSe, CdSe/CdS/ZnS, or CdSe/ZnSe/ZnS. Similarly, for $CuInS_2$ quantum dots, the core/shell nanocrystals can be synthesized using the formula of $CuInS_2$/ZnS, $CuInS_2$/CdS, $CuInS_2$/$CuGaS_2$, $CuInS_2$/$CuGaS_2$/ZnS and so on.

QDs can comprise different materials and examples of red QD compositions are given in Table 1.

TABLE 1

| Red Quantum dot composition (620 nm-660 nm) | |
|---|---|
| CdSe ~4.2 nm | cadmium selenide |
| $Cd_xZn_{1-x}Se$ | cadmium zinc selenide |
| CdZnSeS | cadmium zinc selenium sulfide |
| $CdSe_xS_{1-x}$ | cadmium selenium sulfide |
| CdTe | cadmium telluride |
| $CdTe_xS_{1-x}$ | cadmium tellurium sulfide |
| InP | indium phosphide |
| $In_xGa_{1-x}P$ | indium gallium phosphide |
| InAs | indium arsenide |
| $CuInS_2$ | copper indium sulfide |
| $CuInSe_2$ | copper indium selenide |
| $CuInS_xSe_{2-x}$ | copper indium sulfur selenide |
| $CuIn_xGa_{1-x}S_2$ | copper indium gallium sulfide |
| $CuIn_xGa_{1-x}Se_2$ | copper indium gallium selenide |
| $CuGaS_2$ | copper gallium sulfide |
| $CuIn_xAl_{1-x}Se_2$ | copper indium aluminum selenide |
| $CuInS_2xZnS_{1-x}$ | copper indium sulfur zinc sulfide |
| $CuInSe_2xZnSe_{1-x}$ | copper indium selenium zinc selenide |

Figure 14:
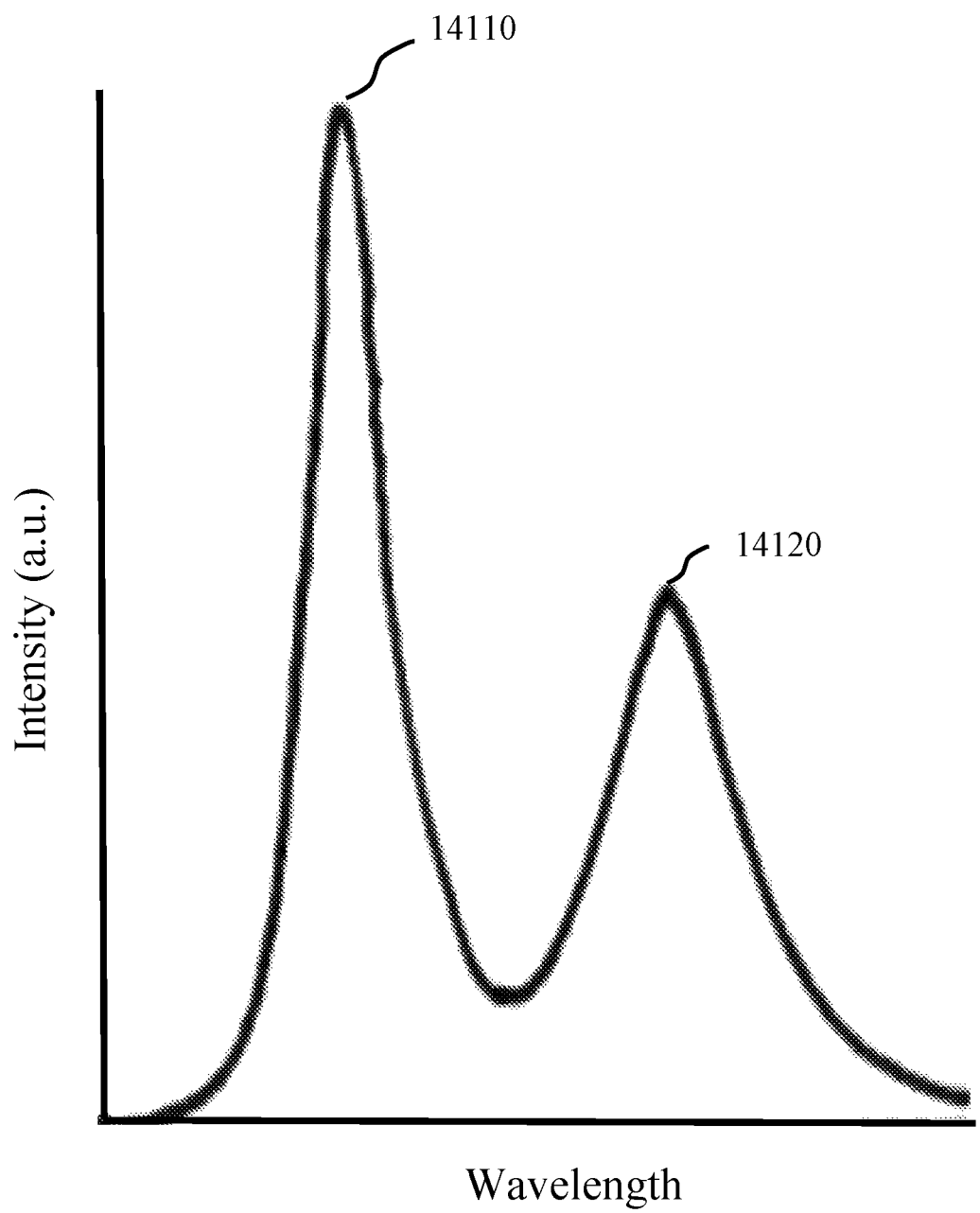
FIG. 14 a measured emission spectrum, intensity versus wavelength, for a Multiple Quantum Well (MQW) dual-wavelength LED.

FIG. 14 a measured emission spectrum, intensity versus wavelength, for a MQW dual-wavelength LED for a color LCD. The MQW dual-wavelength LED comprises a plurality of blue and green quantum wells and generates blue light 14110 with a dominant wavelength NO of about 455 nm and FWHM of about 18 nm and generates green light 14120 with a dominant wavelength ($\lambda_{d2}$) of about 530 nm and FWHM of about 30 nm. The peak emission intensity ratio of green to blue emissions, that is the ratio of the peak emission intensity of the green emission peak to the peak emission intensity of the blue emission peak, is about 40%. Measured test data demonstrates that the peak emission intensity ratio of green to blue emissions from 30% to 60%, though it may be at least 30%, at least 40%, at least 50%, at least 60%, from 30% to 50%, from 30% to 40%, from 40% to 50%, from 40% to 60%, or from 50% to 60%.is at least 30%, at least 40%, at least 50%, and may typically be from 30% to 50%. In order to meet the specific white color points and NTSC target for a specific display color filter (red, green and blue filters), the dominant wavelength of blue and green emissions can be adjusted by the indium doping concentration in the active GaN layer, and the peak intensity ratio of green to blue emissions can be adjusted by the number and position of quantum wells within the MQW structure.

Figure 15:
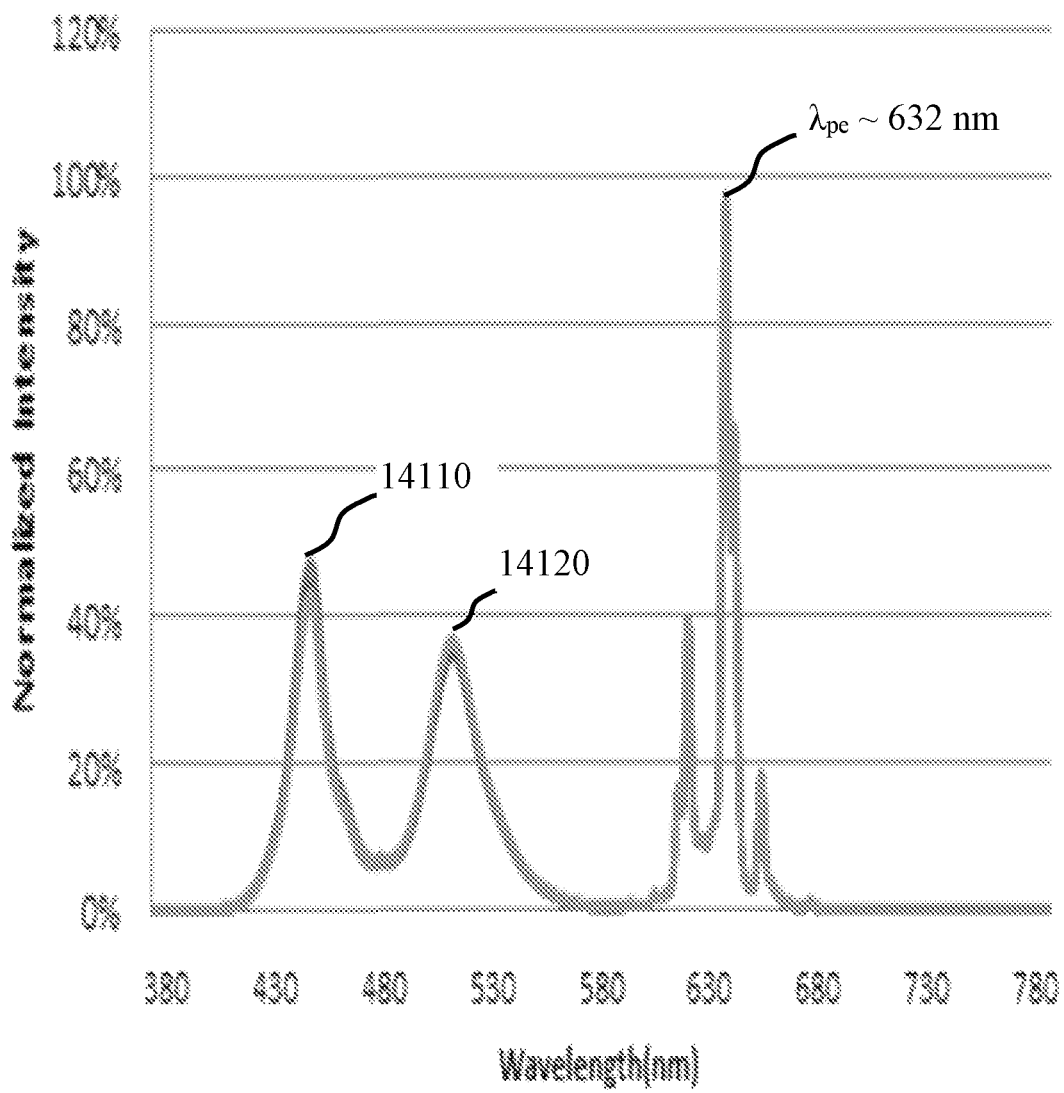
FIG. 15 a measured emission spectrum, intensity versus wavelength, for a packaged light emitting device (backlight) in accordance with an embodiment of the invention.

FIG. 15 a measured emission spectrum, intensity versus wavelength, for a backlight in accordance with an embodiment of the invention, which comprises a SMD package (e.g. the package of FIG. 1) having the MQW dual-wavelength LED of FIG. 14 and narrowband manganese-activated KSF phosphor. In this specific example, the color gamut is calculated to be higher than 90% the area of the NTSC RGB color space standard at a white color point of CIE (0.277, 0.243). Further test results show that backlights formed in accordance with the invention can generate light with a color gamut that is at least 90% of the area of the DCI-P3 RGB color space standard.

Light Emitting Devices for General Lighting Applications

While the present invention finds particular utility for backlighting applications for color LCDs, its utility may also extend to general lighting applications. In general lighting applications, for instance, the MQW dual-wavelength LED can be configured to generate blue light and/or green light having a dominant wavelength from 500 nm to 560 nm and a broader FWHM emission intensity, for example, from about 15 nm to about 60 nm, from about 25 nm to about 60 nm, or from about 45 nm to about 60 nm. In general lighting applications, for example, the red photoluminescence material may have a peak emission intensity wavelength from 600 nm to 660 nm; that is in the orange to red region of the visible spectrum. In general lighting applications, for example, the photoluminescence material may comprise a broadband red photoluminescence material. Examples of broadband red photoluminescence materials (phosphors) are given in Table 2. In some embodiments, the broadband red photoluminescence material comprises a europium-activated silicon nitride-based red phosphor comprises a Calcium Aluminum Silicon Nitride phosphor (CASN) of general formula $CaAlSiN_3:Eu^{2+}$. The CASN phosphor can be doped with other elements such as strontium (Sr), general formula $(Sr,Ca)AlSiN_3:Eu^{2+}$ (SCASN). The CASN phosphor has a peak emission wavelength ($\lambda_{pe}$) from about 620 nm to about 660 nm and has a full width at half maximum emission intensity of from about 70 nm to about 80 nm.

In one embodiment, the red phosphor can comprise a red-emitting phosphor as taught in U.S. Pat. No. 8,597,545 entitled "Red-Emitting Nitride-Based Calcium-Stabilized Phosphors" which is hereby incorporated in its entirety. Such a red emitting phosphor comprises a nitride-based composition represented by the chemical formula $M_aSr_bSi_cAl_dN_eEu_f$, wherein: M is Ca, and $0.1 \leq a \leq 0.4$; $1.5 < b < 2.5$; $4.0 \leq c \leq 5.0$; $0.1 \leq d \leq 0.15$; $7.5 < e < 8.5$; and $0 < f < 0.1$; wherein a+b+f >2+d/v and v is the valence of M.

Alternatively, the red phosphor comprises a red light emitting nitride-based phosphor as taught in U.S. Pat. No. 8,663,502 entitled "Red-Emitting Nitride-Based Phosphors" which is hereby incorporated in its entirety. Such a red emitting phosphor comprising a nitride-based composition represented by the chemical formula $M_{(x/v)}M'_2Si_{5-x}Al_xN_8$:RE, wherein: M is at least one monovalent, divalent or trivalent metal with valence v; M' is at least one of Mg, Ca, Sr, Ba, and Zn; and RE is at least one of Eu, Ce, Tb, Pr, and Mn; wherein x satisfies $0.1 \leq x < 0.4$, and wherein said red-emitting phosphor has the general crystalline structure of $M'_2Si_5N_8$:RE, Al substitutes for Si within said general crystalline structure, and M is located within said general crystalline structure substantially at the interstitial sites. Examples of such red nitride phosphors are the XR series of phosphors from Intematix Corporation, Fremont California, USA.

TABLE 2

Example broadband red photoluminescence materials

| Phosphor | General Composition | | Wavelength $\lambda_{pe}$ (nm) | FWHM (nm) |
|---|---|---|---|---|
| CASN | $(Ca_{1-x}Sr_x)AlSiN_3:Eu$ | $0.5 < x \leq 1$ | 600-660 | 73-78 |
| 258 nitride | $Ba_{2-x}Sr_xSi_5N_8:Eu$ | $0 \leq x \leq 2$ | 580-620 | 79 |

The invention claimed is:

1. A light emitting device comprising:
a dual-wavelength Light Emitting Diode (LED) chip; and
a manganese-activated fluoride phosphor comprising at least one of: $K_2SiF_6:Mn^{4+}$, $K_2TiF_6:Mn^{4+}$ and $K_2GeF_6:Mn^{4+}$ for generating light with a peak emission wavelength from 620 nm to 660 nm; and
wherein the dual-wavelength LED chip comprises a first p-n junction diode comprising a first Multiple Quantum Well structure for generating a first light with a dominant wavelength from 440 nm to 470 nm and a full width at half maximum emission intensity from 15 nm to 25 nm and a second p-n junction diode comprising a second Multiple Quantum Well structure for generating a second light with a dominant wavelength from 520 nm to 540 nm and a full width at half maximum emission intensity from 15 nm to 25 nm.

2. The light emitting device of claim 1, wherein the manganese-activated fluoride phosphor is disposed on the dual-wavelength LED chip.

3. The light emitting device of claim 1, wherein the manganese-activated fluoride phosphor comprises a layer located remotely to the dual-wavelength LED chip.

4. The light emitting device of claim 1, wherein the device is for generating light with a spectrum having a color gamut which is at least one of: at least 90% NTSC RGB color space standard, and at least 90% DCI-P3 RGB color space standard.

5. The light emitting device of claim 1, wherein the first light and the second light comprise a respective peak, and wherein a ratio of a peak emission intensity of the second light to a peak emission intensity of the first light is from 30% to 60%.

6. The light emitting device of claim 1, wherein each of the first and second p-n junction diodes comprises an InGaN Multiple Quantum Well structure disposed between a p-doped GaN layer and n-doped GaN layer.

7. The light emitting device of claim 6, wherein the first p-n junction diode comprises a first InGaN Multiple Quantum Well structure disposed between a first p-doped GaN layer and a first n-doped GaN layer, and the second p-n junction diode comprises a second InGaN Multiple Quantum Well structure disposed between a second p-doped GaN layer and a second n-doped GaN layer.

8. The light emitting device of claim 7, wherein the first and second p-n junction diodes are disposed on top of each other.

9. The light emitting device of claim 6, wherein the InGaN Multiple Quantum Well structures are disposed between the same p-doped GaN and n-doped GaN layers.

10. The light emitting device of claim 9, wherein the InGaN Multiple Quantum Well structures are adjacent each other.

11. The light emitting device of claim 9, wherein the InGaN Multiple Quantum Well structures are disposed on top of each other.

12. The light emitting device of claim 9, wherein the InGaN Multiple Quantum Well structures are integrated as a single structure.

13. The light emitting device of claim 1, wherein the light emitting device comprises a display backlight.

* * * * *